United States Patent
Omoto et al.

(10) Patent No.: US 7,399,706 B2
(45) Date of Patent: Jul. 15, 2008

(54) MANUFACTURING METHOD OF SEMICONDUCTOR DEVICE

(75) Inventors: Seiichi Omoto, Yokohama (JP); Tomio Katata, Yokohama (JP); Kazuyuki Higashi, Yokohama (JP); Hitomi Yamaguchi, Yokohama (JP); Hirokazu Ezawa, Tokyo (JP); Atsuko Sakata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 302 days.

(21) Appl. No.: 11/041,362

(22) Filed: Jan. 25, 2005

(65) Prior Publication Data

US 2005/0186793 A1    Aug. 25, 2005

(30) Foreign Application Priority Data

Jan. 26, 2004   (JP) .............................. 2004-017340
Dec. 28, 2004   (JP) .............................. 2004-381583

(51) Int. Cl.
*H01L 21/44* (2006.01)
(52) U.S. Cl. ................ 438/687; 438/652; 257/E21.585
(58) Field of Classification Search ................ 438/687, 438/652; 257/E21.585
See application file for complete search history.

(56) References Cited

U.S. PATENT DOCUMENTS

| | | |
|---|---|---|
| 6,004,188 A | 12/1999 | Roy |
| 6,103,618 A | 8/2000 | Abe |
| 6,204,167 B1 | 3/2001 | Taniguchi |
| 6,348,402 B1 | 2/2002 | Kawanoue et al. |
| 6,420,258 B1 | 7/2002 | Chen et al. |
| 6,498,098 B1 | 12/2002 | Abe |
| 6,541,864 B1 * | 4/2003 | Fukuzumi .................. 257/758 |

(Continued)

FOREIGN PATENT DOCUMENTS

| | | |
|---|---|---|
| JP | 08-017920 A2 | 1/1996 |
| JP | 11-45887 | 2/1999 |
| JP | 2001-244265 A2 | 9/2001 |
| JP | 2001-338925 | 12/2001 |

OTHER PUBLICATIONS

Japanese Patent Office Action mailed by the Japanese Patent Office on Oct. 17, 2006 in counterpart Japanese Application No. 2004-381583.

(Continued)

*Primary Examiner*—Michael S. Lebentritt
*Assistant Examiner*—Stanetta D Isaac
(74) *Attorney, Agent, or Firm*—Finnegan, Henderson, Farabow, Garrett & Dunner, L.L.P.

(57) ABSTRACT

There is here disclosed a manufacturing method of a semiconductor device, comprising providing a first film by a PVD process in a recess formed in at least one insulating film, the first film containing at least one metal element belonging to any one of the groups 4-A, 5-A, and 6-A, continuously providing a second film by at least one of CVD and ALD processes on the first film without opening to atmosphere, the second film containing at least one metal element belonging to any one of the groups 4-A, 5-A, and 6-A, continuously providing a third film by the PVD process on the second film without opening to the atmosphere, the third film containing at least one metal element belonging to any one of the groups 4-A, 5-A, and 6-A, continuously providing a first Cu film on the third film without opening to the atmosphere, and heating the Cu film.

10 Claims, 15 Drawing Sheets

U.S. PATENT DOCUMENTS

| | | | |
|---|---|---|---|
| 6,624,516 B2* | 9/2003 | Fujisawa et al. | 257/762 |
| 6,770,977 B2* | 8/2004 | Kishida et al. | 257/761 |
| 6,780,769 B2* | 8/2004 | Fujisawa et al. | 438/687 |
| 6,936,906 B2* | 8/2005 | Chung et al. | 257/486 |
| 7,049,226 B2* | 5/2006 | Chung et al. | 438/648 |
| 7,211,508 B2* | 5/2007 | Chung et al. | 438/633 |
| 2003/0087520 A1* | 5/2003 | Chen et al. | 438/643 |
| 2003/0141601 A1 | 7/2003 | Fukuzumi | |
| 2004/0256351 A1* | 12/2004 | Chung et al. | 216/13 |
| 2005/0009325 A1* | 1/2005 | Chung et al. | 438/637 |
| 2005/0106865 A1* | 5/2005 | Chung et al. | 438/685 |
| 2006/0148253 A1* | 7/2006 | Chung et al. | 438/681 |

OTHER PUBLICATIONS

Chinese Patent Office Action mailed by the Chinese Patent Office on Sep. 8, 2006 in counterpart Chinese Application No. 2005100029250.

K. Abe et al., "Effect of Ti Insertion Between Cu and TiN Layers on Electromigration Reliability in Cu(Ti)/TiN/Ti Layered Damascene Interconnects", IEEE, 38$^{th}$ Annual International Reliability Physics Symposium, pp. 333-338, (2000).

M. Sekiguchi et al., "Electromigration of Cu Damascene Interconnects With (Ti)/CVD-TiN(Ti) Underlayer", Materials Research Society, pp. 533-538, (2002).

T. Nogami et al., "Graded Ta/TaN/Ta Barrier for Copper Interconnects for High Electromigration Resistance", Materials Research Society, pp. 313-319, (1999).

K. Higashi, "Highly Reliable PVD/ALD/PVD Stacked Barrier Metal Structure for 45NM-Node Copper Dual-Damascene Interconnects", IEEE Electron Devices Society, pp. 6-8, (Jun. 7-9, 2004).

* cited by examiner

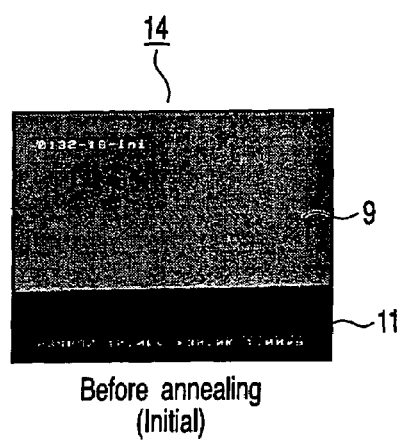
Before annealing
(Initial)
F I G. 5A
Before annealing
(Initial)
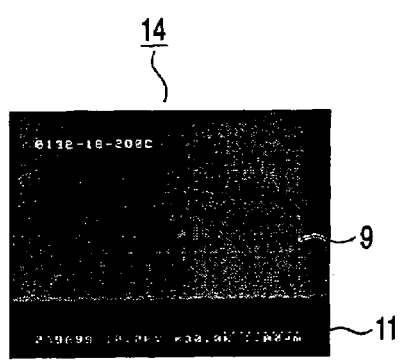
After annealing
(about 200°C, about 1 hour)
F I G. 5B
After annealing
(about 200°C, about 1 hour)
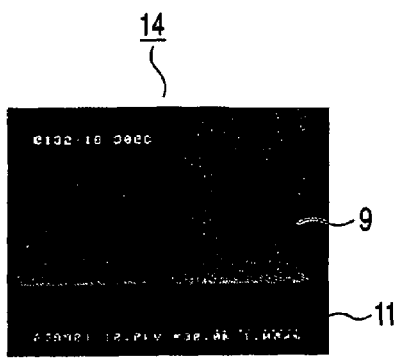
After annealing
(about 300°C, about 1 hour)
F I G. 5C
After annealing
(about 300°C, about 1 hour)

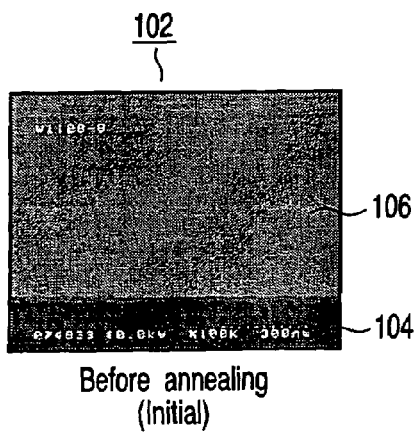
FIG. 7A (PRIOR ART) Before annealing (Initial)
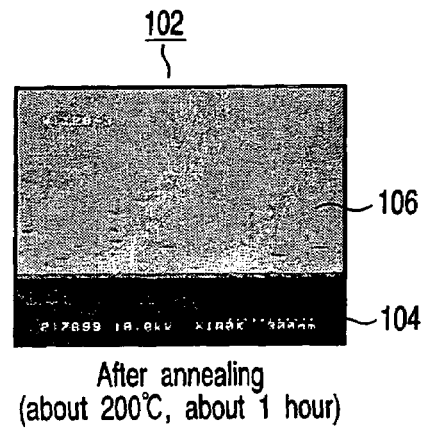
FIG. 7B (PRIOR ART) After annealing (about 200°C, about 1 hour)
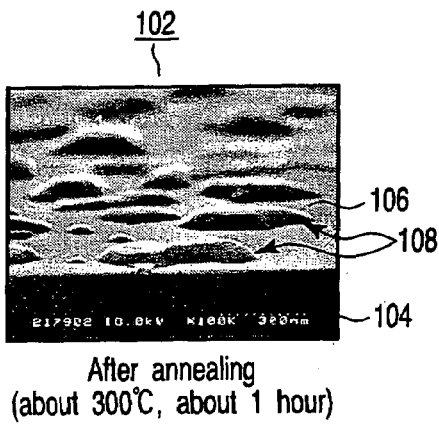
FIG. 7C (PRIOR ART) After annealing (about 300°C, about 1 hour)
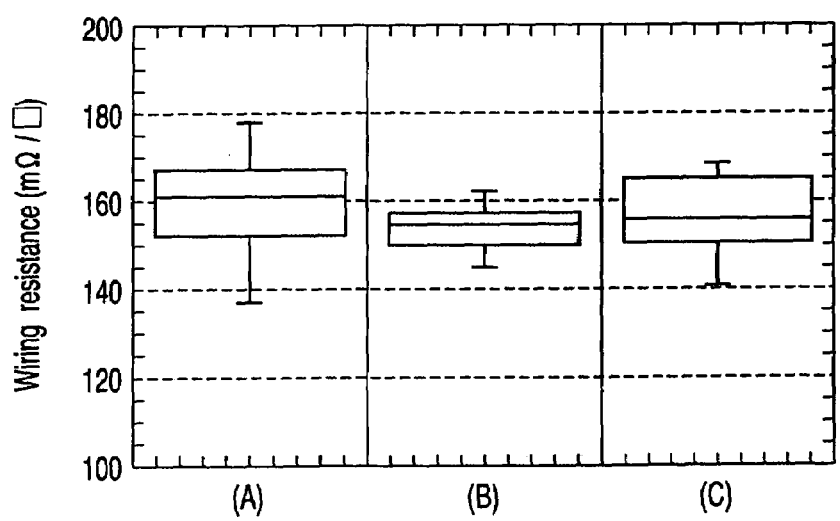
FIG. 8

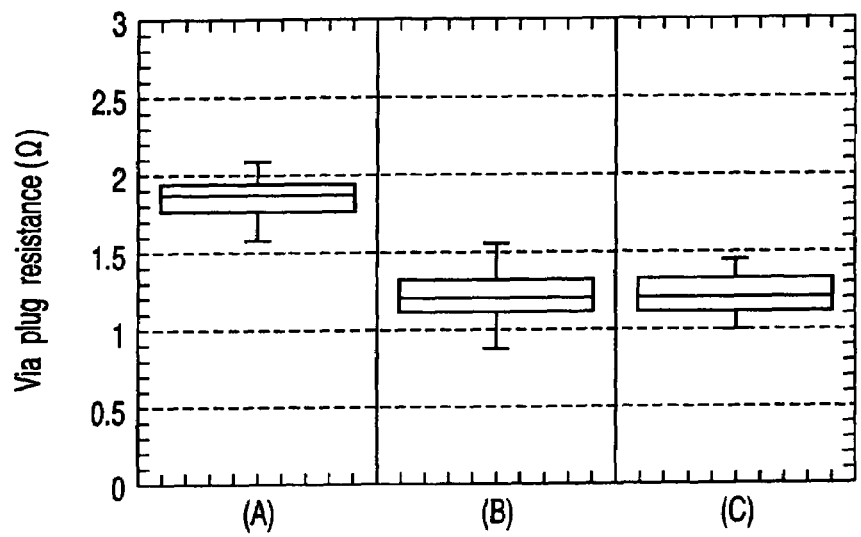
F I G. 9
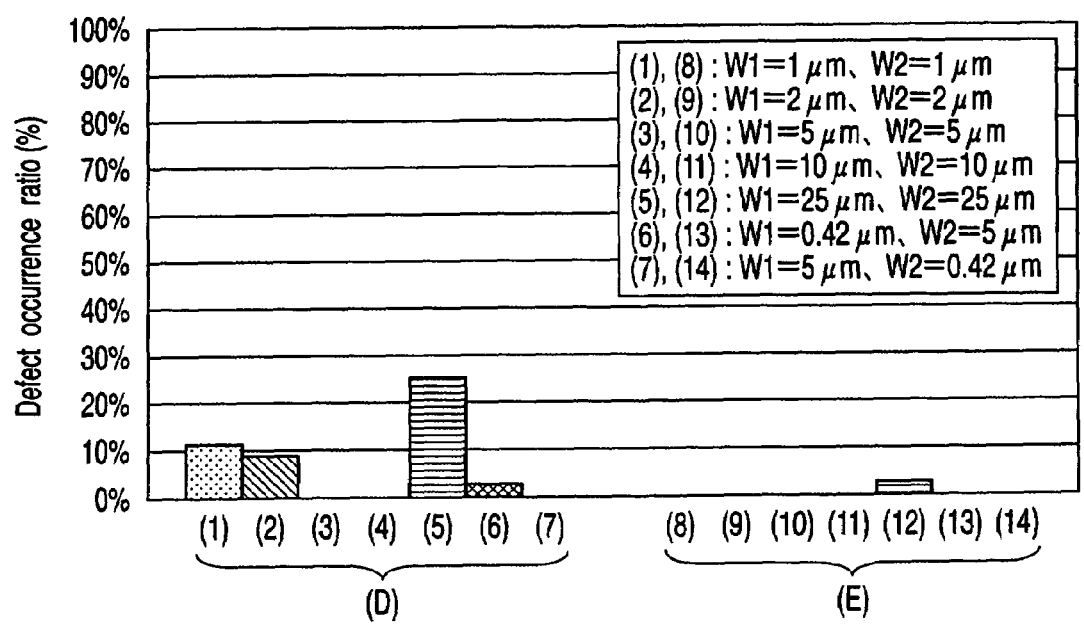
F I G. 10

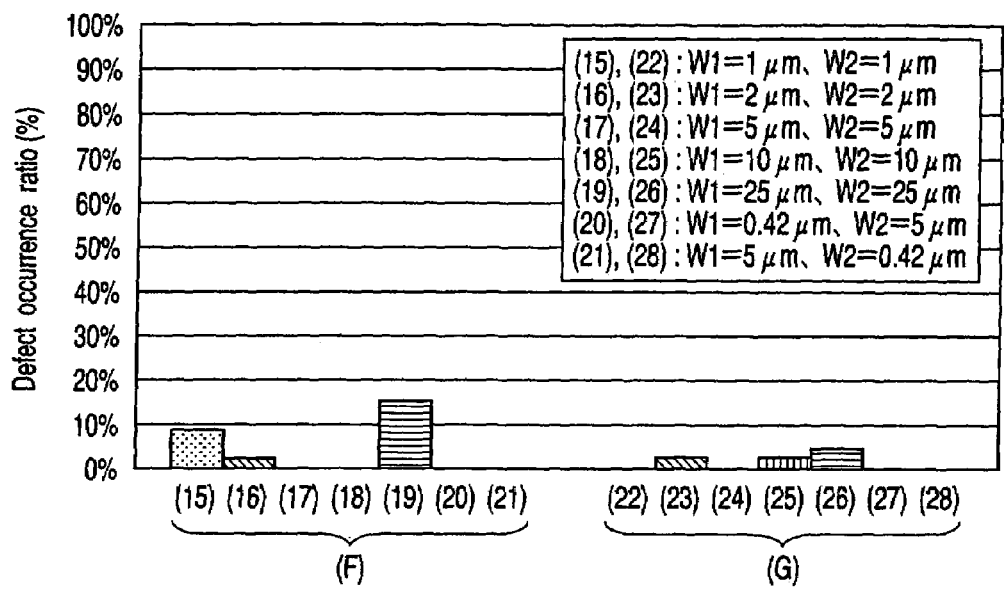
F I G. 11
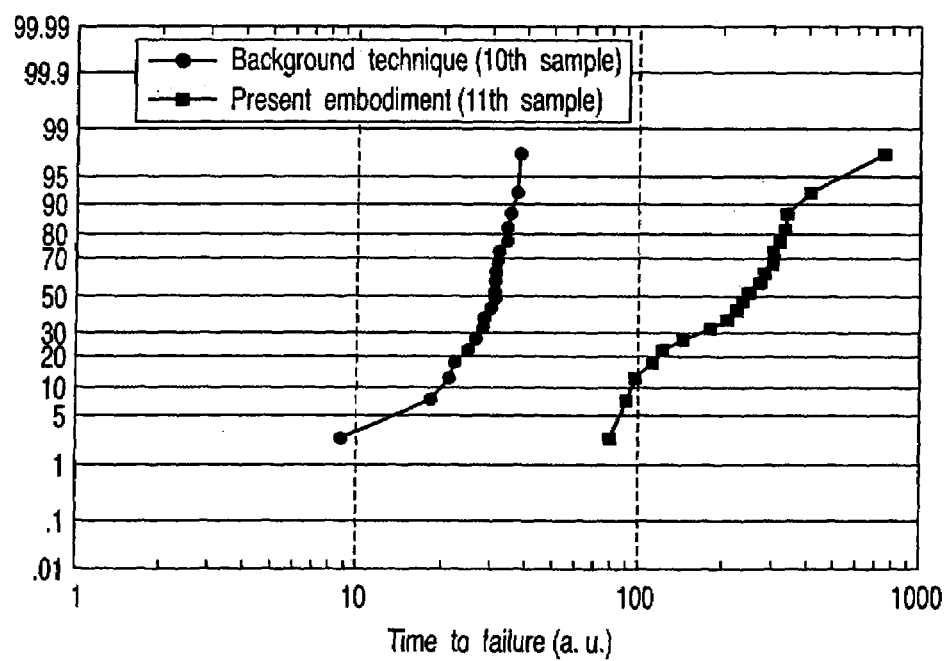
F I G. 12

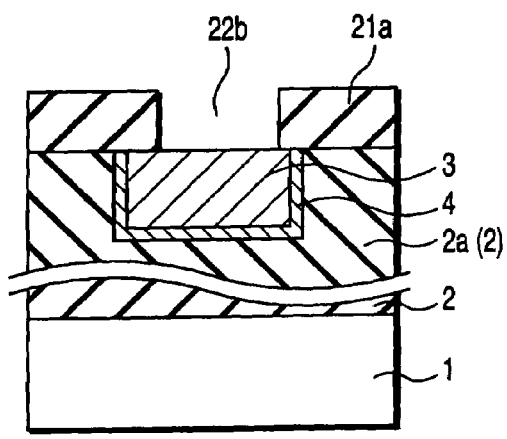
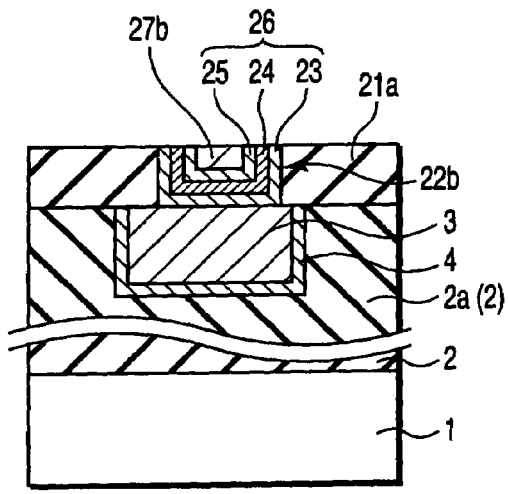
FIG. 13A  FIG. 13B
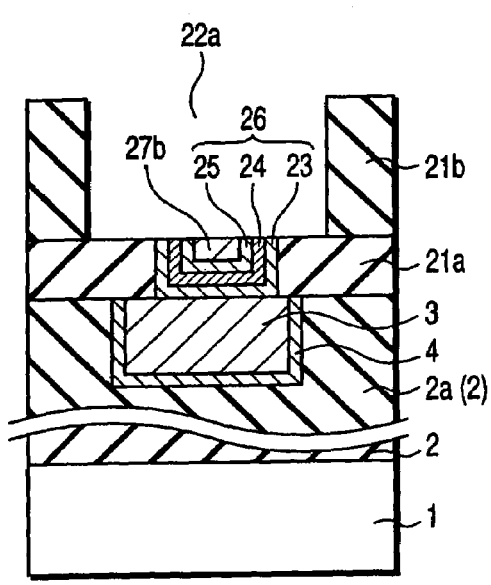
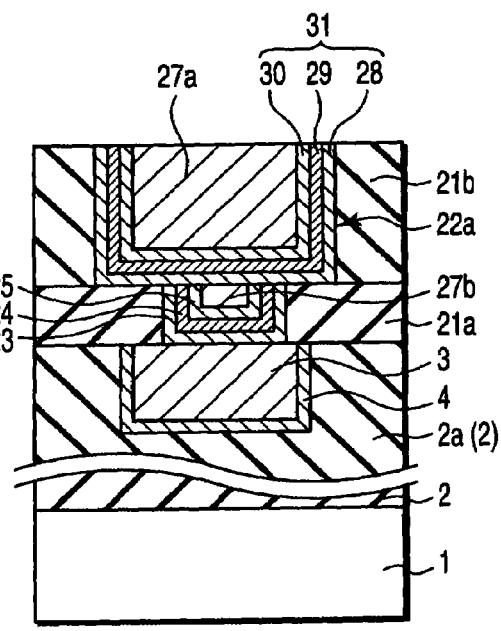
FIG. 14A  FIG. 14B

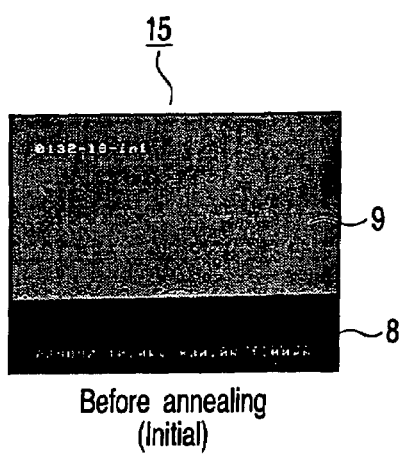
Before annealing
(Initial)
F I G. 22A
Before annealing
(Initial)
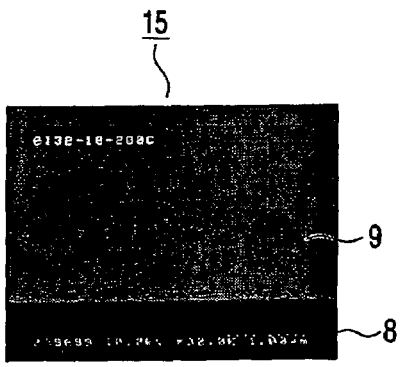
After annealing
(about 370°C, about 1 hour)
F I G. 22B
After annealing
(about 370°C, about 1 hour)
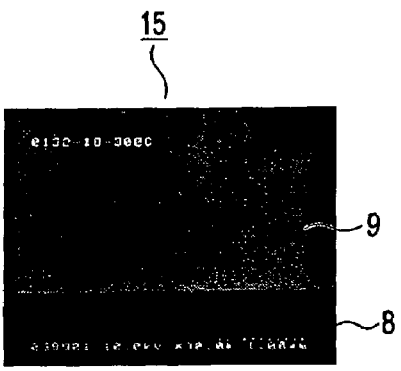
After annealing
(about 450°C, about 1 hour)
F I G. 22C
After annealing
(about 450°C, about 1 hour)

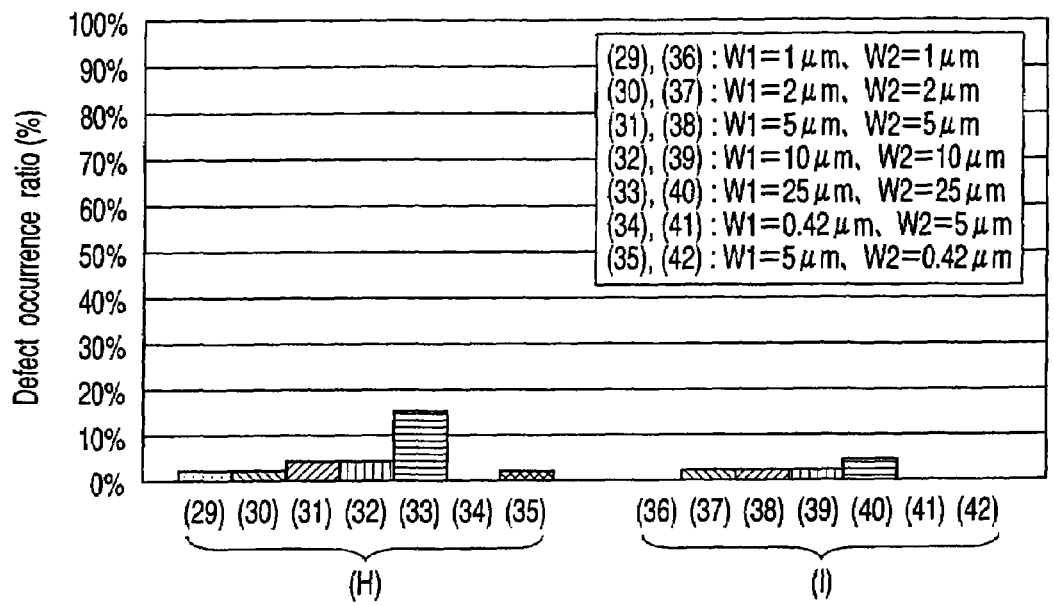
F I G. 24
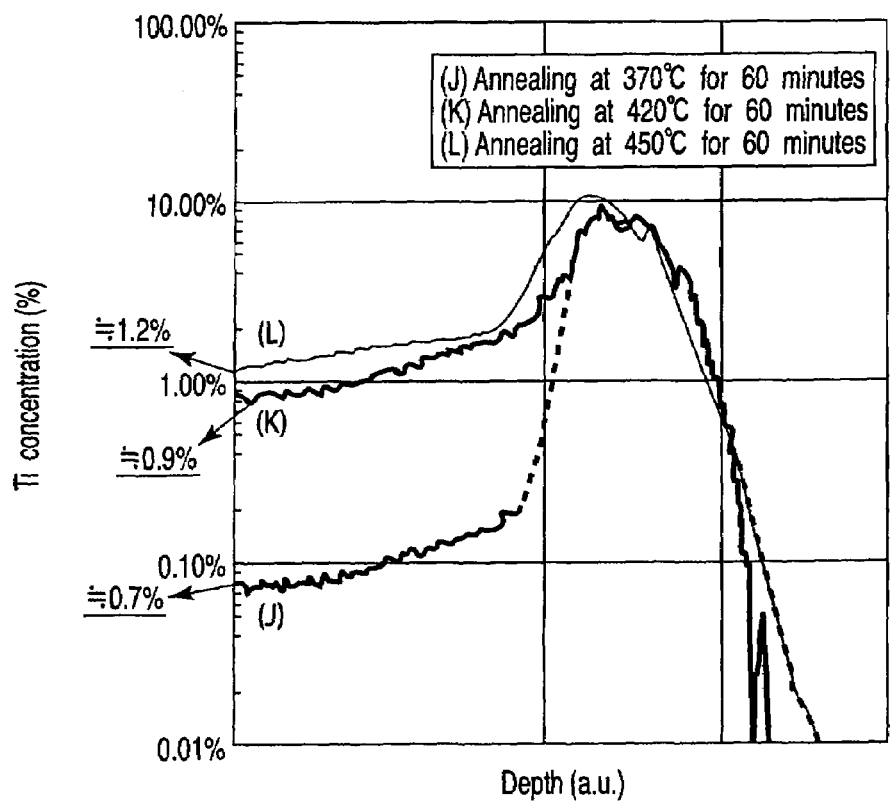
F I G. 25

MANUFACTURING METHOD OF SEMICONDUCTOR DEVICE

CROSS-REFERENCE TO RELATED APPLICATIONS

This application is based upon and claims the benefit of priority from prior Japanese Patent Applications No. 2004-017340, filed Jan. 26, 2004; and No. 2004-381583, filed Dec. 28, 2004, the entire contents of both of which are incorporated herein by reference.

BACKGROUND OF THE INVENTION

1. Field of the Invention

The present invention relates to a technique for manufacturing a semiconductor device comprising a Cu film, particularly to a method of manufacturing a semiconductor device comprising a Cu film buried in an insulating film together with a barrier metal film.

2. Description of the Related Art

Usually in a case where a wiring is provided inside the semiconductor device, a barrier metal film is provided around a wiring in order to prevent the wiring from being easily deteriorated. This technique is described, for example, in Jpn. Pat. Appln. KOKAI Publication No. 8-17920 or 2001-244265. A general method of forming a Cu wiring will be briefly described hereinafter.

First, a groove for the wiring is formed in an interlayer insulating film of a layer in which a Cu wire is provided. When the Cu wire is connected to conductive layers provided below, such as a wiring layer and a diffusion layer, a hole for a connection plug is made in such a manner as to communicate with the groove for the wiring. For example, the groove for the wiring and the hole for the connection plug are integrally formed through the interlayer insulating film, and the surface of the conductive layer is exposed. Next, the inner wall surfaces of the wiring groove and the connection plug hole, and the surface of the conductive layer are coated with a barrier metal film by a PVD process. Next, a seed Cu layer is provided on the barrier metal film to constitute an underlayer in providing a Cu film (Cu layer) which is a main portion of the Cu wire. Subsequently, a Cu film is grown on this seed Cu film by a Cu plating technique to fill in the wiring groove and the connection plug hole. Next, the barrier metal film and the Cu film on the interlayer insulating film are polished and removed by a CMP process, and a desired buried wire (damascene wire) is formed of Cu. To form an upper-layer wire further on the Cu wire, after providing the interlayer insulating film over the Cu wire, a desired upper-layer wire is formed on the interlayer insulating film by a method similar to the above-described method.

In general, the seed Cu film is formed at low temperature of 25° C. (room temperature) or less in order to prevent Cu from aggregating. Moreover, the Cu film on the seed Cu film is plated/grown at room temperature. Additionally, the Cu film (Cu wire, Cu plug) formed at low temperature in this manner has low reliability (resistance) with respect to defects such as stress migration and electro migration, because crystal grains are small. Therefore, to enhance the reliability of the Cu wire (Cu plug) with respect to the defects, usually an annealing treatment is performed at high temperature of 100° C. or more after a Cu plating treatment. Accordingly, crystal grain growth of the Cu film is promoted, and the reliability of the Cu wire is enhanced.

As described above, the annealing treatment after the Cu plating treatment is performed at high temperature of 100° C. or more. To provide the upper-layer wire on the Cu wire, the interlayer insulating film for the upper-layer wire is also formed generally at high temperature of 350° C. or more. When the Cu wire has low adhesion to the barrier metal film, and the Cu wire is brought under environment at high temperature, Cu atoms and vacancies in the Cu wire move along an interface between the barrier metal film and the seed Cu film. When a lower-layer wire connected to the Cu wire is a Cu wire, and the barrier metal film provided around a Cu via plug has low adhesion to the lower-layer Cu wire, similar phenomenon occurs in the interface between the barrier metal film and the lower-layer Cu wire. As a result, voids are formed in the Cu wire or the lower-layer Cu wire, and reliabilities, qualities, and electric characteristics of the respective Cu wires drop. Additionally, the reliability, quality, performance, yield and the like of the semiconductor device drop.

Moreover, since the seed Cu film is formed while cooling a substrate at low temperature which is not more than room temperature as described above, surface diffusion phenomenon cannot be utilized in forming the seed Cu film. Therefore, coverage inside the connection plug hole by the seed Cu film drops, or an overhang portion by the seed Cu film largely grows in an opening of the wiring groove. These are obstacles in plating/growing the Cu film to fill in the connection plug hole and the wiring groove after forming the seed Cu film. To inhibit the drop of the coverage or the growth of the overhang portion, a technique using a CVD or ALD film as the barrier metal film is tried. However, since the CVD or ALD film has low adhesion to the seed Cu film, the voids are easily generated in the Cu wire in a process (heating process) of forming the Cu wire. The CVD or ALD film is sensitive to type or state of the insulating film which is an underlayer. That is, it is difficult to directly and stably form the CVD or ALD film on the insulating film. Therefore, when the CVD or ALD film is used alone in the barrier metal film, there is a high possibility that the reliability or the quality of the Cu wire remarkably drops.

Furthermore, to inhibit the phenomenon in which the Cu atoms and vacancies in the Cu wire move along the interface between the barrier metal film and the seed Cu film, for example, a technique using Ti as a raw material of the barrier metal film is also known. However, if the Cu wire and the Ti barrier metal film are annealed at temperature of 450° C. or more, diffused amount of Ti in the Cu wire remarkably increases. Then, resistance of the Cu wire accordingly increases, and a problem that a resistance value is not up to standard occurs.

BRIEF SUMMARY OF THE INVENTION

According to an aspect of the invention, there is provided a manufacturing method of a semiconductor device, comprising: providing a first barrier metal film by a PVD process in a recess formed in at least one insulating film provided above a substrate, the first barrier metal film containing at least one metal element belonging to any one of the groups 4-A, 5-A, and 6-A; continuously providing a second barrier metal film by at least one of CVD and ALD processes on the first barrier metal film without opening to atmosphere, the second baffler metal film containing at least one metal element belonging to any one of the groups 4-A, 5-A, and 6-A; continuously providing a third barrier metal film by a PYD process on the second barrier metal film without opening to the atmosphere, the third barrier metal film containing at least one metal element belonging to any one of the groups 4-A, 5-A, and 6-A; continuously providing a first Cu film on the third barrier metal film without opening to the atmosphere; and heating the first Cu film.

According to another aspect of the invention, there is provided a semiconductor device comprising: a first barrier metal film provided by a PVD process in a recess formed in at least one insulating film provided above a substrate, and containing at least one metal element belonging to any one of the groups 4-A, 5-A, and 6-A; a second barrier metal film continuously provided by at least one of CVD and ALD processes on the first barrier metal film without being opened to atmosphere, and containing at least one metal element belonging to any one of the groups 4-A, 5-A, and 6-A; a third barrier metal film continuously provided by the PVD process on the second barrier metal film without being opened to the atmosphere, and containing at least one metal element belonging to any one of the groups 4-A, 5-A, and 6-A; and a first Cu film continuously provided on the third barrier metal film without being opened to the atmosphere and thereafter heated.

BRIEF DESCRIPTION OF THE SEVERAL VIEWS OF THE DRAWING

FIGS. 5A to 5C are photographs showing dependence, on temperature, of a surface state of a Cu seed layer provided by the method of manufacturing the semiconductor device according to the first embodiment;

FIGS. 7A to 7C are photographs showing the dependence, on the temperature, of the surface state of the Cu seed layer provided by the method of manufacturing the semiconductor device according to another mode of the background technique which is the comparative example with respect to the first embodiment;

FIG. 8 is a graph showing resistance values of a Cu wire according to the first embodiment and that according to the background technique after a sinter test;

FIG. 9 is a graph showing resistance values of a Cu via plug according to the first embodiment and that according to the background technique after the sinter test;

FIG. 10 is a graph showing dependences, on wiring widths, of SIV resistances of a combination of a Cu wire and a lower-layer Cu wire according to the first embodiment using a CVD film as a second barrier metal film, and a combination of the Cu wire and the lower-layer Cu wire according to the background technique;

FIG. 11 is a graph showing the dependences, on the wiring widths, of the SIV resistances of the combination of the Cu wire and the lower-layer Cu wire according to the first embodiment using an ALD film as the second barrier metal film, and a combination of the Cu wire and the lower-layer Cu wire according to the background technique;

FIG. 12 is a graph showing TTF of the Cu wire according to the first embodiment and that according to the background technique by an electro migration resistance test;

FIGS. 13A and 13B are process sectional views showing the method of manufacturing the semiconductor device according to a second embodiment;

FIGS. 14A and 14B are process sectional views showing the method of manufacturing the semiconductor device according to the second embodiment;

FIGS. 22A to 22C are photographs showing the dependence of the surface state of the Cu seed layer provided by the method of manufacturing the semiconductor device according to the fourth embodiment on the temperature;

FIG. 24 is a graph showing the dependences, on the wiring widths, of the SIV resistances of the combination of the Cu wire and the lower-layer Cu wire according to the fourth embodiment using a PVD-Ti film as the barrier metal film, and the combination of the Cu wire and the lower-layer Cu wire according to the background technique;

FIG. 25 is a graph showing Ti concentration in the Cu wire according to the fourth embodiment, and depth of diffusion of Ti for each of different sinter annealing temperatures.

DETAILED DESCRIPTION OF THE INVENTION

Figure 1A:
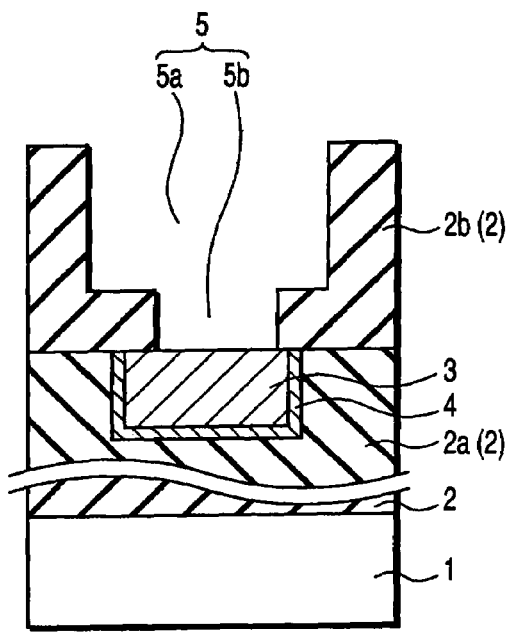
FIGS. 1A and 1B are process sectional views showing a method of manufacturing a semiconductor device according to a first embodiment.

Embodiments of the present invention will be described hereinafter with reference to drawings.

First Embodiment

First, a first embodiment of the present invention will be described with reference to FIGS. 1A to 12. FIGS. 1A to 4B are process sectional views showing a method of manufacturing a semiconductor device according to the present embodiment. FIGS. 5A to 5C are photographs showing dependence, on temperature, of a surface state of a Cu seed layer provided by the method of manufacturing the semiconductor device according to the present embodiment. FIGS.

6A to 6C and FIGS. 7A to 7C are photographs showing the dependence, on the temperature, of the surface state of the Cu seed layer provided by the method of manufacturing the semiconductor device according to a background technique which is a comparative example with respect to the present embodiment. FIG. 8 is a graph showing resistance values of a Cu wire according to the present embodiment and that according to the background technique after a sinter test. FIG. 9 is a graph showing resistance values of a Cu via plug according to the present embodiment and that according to the background technique after the sinter test. FIG. 10 is a graph showing dependences, on wiring widths, of SIV resistances of a combination of a Cu wire and a lower-layer Cu wire according to the present embodiment using a CVD film as a second barrier metal film, and a combination of the Cu wire and the lower-layer Cu wire according to the background technique. FIG. 11 is a graph showing the dependences, on the wiring widths, of the SIV resistances of the combination of the Cu wire and the lower-layer Cu wire according to the first embodiment using an ALD film as the second barrier metal film, and a combination of the Cu wire and the lower-layer Cu wire according to the background technique. FIG. 12 is a graph showing TTF of the Cu wire according to the first embodiment and that according to the background technique by an electro migration resistance test.

In the present embodiment, a Cu wire coated with a barrier metal film is provided using a film forming technique of the barrier metal film by a chemical vapor deposition (CVD) or atomic layer deposition (ALD) process, a film forming technique of a seed Cu film, and a film forming technique of a Cu film by a plating process. In this case, by a physical vapor deposition (PVD) process, barrier metal films are formed of a metal alone on opposite sides of the barrier metal film formed by the CVD or ALD process. Accordingly, resistance of the Cu wire with respect to stress induced voiding (SIV) or electro migration (EM), that is, reliability of the Cu wire is enhanced. Additionally, resistance of a semiconductor device comprising a Cu multilayered wiring structure including the Cu wire with respect to the SIV or EM, that is, the reliability of the semiconductor device comprising the Cu multilayered wiring structure is enhanced. This will be described hereinafter in detail.

First, the semiconductor device and the manufacturing method according to the present embodiment will be described with reference to FIGS. 1A to 4B.

As shown in FIG. 1A, a plurality of inter level dielectrics (ILDs) 2 formed, for example, of $SiO_2$ or the like are stacked and provided on a semiconductor substrate (silicon wafer) 1 by a CVD process. An element separating region, an active region, various semiconductor elements (not shown) and the like are provided in the semiconductor substrate 1. At least one lower-layer Cu wire 3 which is an n−1-th (n is an integer of 2 or more) layer constituting a lower-layer conductive layer is provided in an inter level dielectric (lower-layer insulating film) 2a among the respective inter level dielectrics 2. The lower-layer Cu wire 3 is coated with a barrier metal film 4 formed, for example, of a Ti single-layer film. The lower-layer Cu wire 3 is electrically connected to the active region, various semiconductor elements or the like provided in the semiconductor substrate 1 via an interlayer connecting wire (not shown). An inter level dielectric 2b of an n-th layer is provided on the inter level dielectric 2a of the n−1-th layer. Steps of manufacturing n-th or more layers will be described hereinafter.

First, as shown in FIG. 1A, a recess 5 for providing first to third barrier metal films 6, 7, 8 described later and a Cu film (Cu layer) 12 of an n-th layer is formed in the inter level dielectric 2b of the n-th layer. This Cu film 12 comprises a first Cu film 9 and a second Cu film 10 formed by mutually different film forming methods as described later. Additionally, the second Cu film 10 is formed integrally with the first Cu film 9. In the present embodiment, the Cu film 12 is formed as the Cu conductive layer 12 comprising a Cu wire 12a of an n-th layer, and a Cu via plug 12b electrically connecting the Cu wire 12a to the lower-layer Cu wire 3. That is, the Cu wire 12a is provided as so-called effective wire which is electrically connected to the lower-layer Cu wire 3 and which actually functions as a wire. In this case, the Cu conductive layer 12 is formed into a so-called dual damascene structure in which the Cu wire 12a is integrated with the Cu via plug 12b. Therefore, the recess 5 for the conductive layer comprises a wiring recess (wiring groove) 5a for providing the Cu wire 12a, and a plug recess (via hole) 5b for providing the Cu via plug 12b. Moreover, the via hole 5b is connected to and formed integrally with the wiring groove 5a.

Concretely, first, a resist mask (not shown) for forming the via hole is provided on the inter level dielectric 2b of the n-th layer, and a predetermined plug pattern of the Cu via plug 12b is patterned on the surface of the inter level dielectric 2b. Subsequently, the inter level dielectric 2b is etched along the plug pattern, for example, by an RIE process until the surface of the lower-layer Cu wire 3 is exposed. Accordingly, the via hole 5b is formed of a predetermined pattern extending through the inter level dielectric 2b along a thickness direction. Thereafter, the resist mask for forming the via hole is peeled and removed from the inter level dielectric 2b. Next, a resist mask (not shown) for forming the wiring groove is provided on the inter level dielectric 2b in which the via hole 5b is formed, and a predetermined wiring pattern of the Cu wire 12a is patterned on the surface of the inter level dielectric 2b. Subsequently, the inter level dielectric 2b is etched to a middle portion of the thickness direction along the wiring pattern by the RIE process. Accordingly, the wiring groove 5a constituted of the predetermined pattern is formed in such a manner as to communicate with the via hole 5b. Thereafter, the resist mask for forming the wiring groove is peeled and removed from the inter level dielectric 2b. Thus, the recess 5 for the conductive layer of the n-th layer, in which the via hole 5b is integrated communicating with the wiring groove 5a, is formed into the predetermined pattern in the inter level dielectric 2b of the n-th layer.

Next, a barrier metal film 11 and a Cu conductive layer 12 are provided in the via hole 5b for the conductive layer of the n-th layer. As described in the background technique, a barrier metal film and a seed Cu film have heretofore been continuously formed in vacuum by the PVD process. Moreover, after forming the seed Cu film, a Cu plating film is formed on the seed Cu film by a plating process. Thereafter, the inter level dielectric, the Cu film or the like is subjected to an annealing or CMP process. If necessary, an inter level dielectric is further provided over the Cu film. On the other hand, in the present embodiment, the second barrier metal film 7 formed of a CVD film is provided between the first and third barrier metal films 6, 8 formed of PVD films. This will be described hereinafter concretely.

Figure 1B:
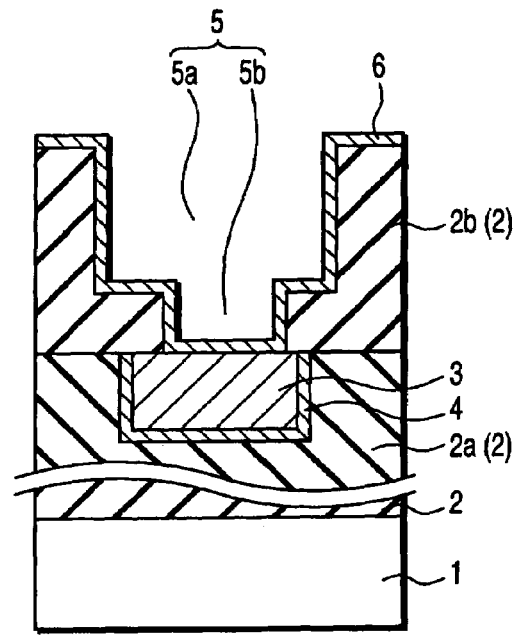

First, as shown in FIG. 1B, the surface of the inter level dielectric 2b of the n-th layer and the exposed surface of the lower-layer Cu wire 3 are coated, and the first barrier metal film (lower barrier metal layer) 6 is provided as a metal layer (conductive layer) formed of Ti alone in the recess 5 for the conductive layer. This Ti film 6 is formed into a film thickness of about 3 nm without being opened to the atmosphere (exposed to the atmosphere) by a sputtering process which is one type of PVD process.

Figure 2A:
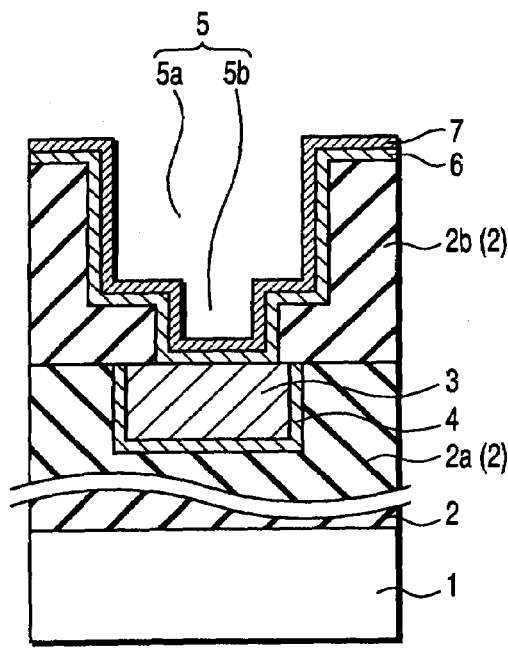
FIGS. 2A and 2B are process sectional views showing the method of manufacturing the semiconductor device according to the first embodiment.

Next, as shown in FIG. 2A, the second barrier metal film (intermediate barrier metal layer) 7 formed of TiSiN which is a metal nitride compound is provided on the surface of the first barrier metal film (Ti film) 6. This TiSiN film 7 is formed into a film thickness of about 3 nm continuously from the Ti film 6 by the CVD process without being opened to the atmosphere. This TiSiN film 7 is a conductive layer similar to the Ti film 6.

Figure 2B:
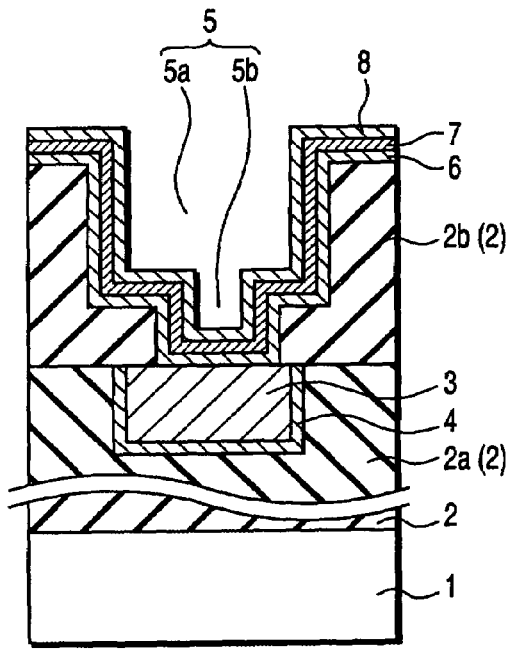

Next, as shown in FIG. 2B, the third barrier metal film (upper barrier metal layer) 8 formed of Ti alone is provided on the surface of the second barrier metal film (TiSiN film) 7. This Ti film 8 is formed into a film thickness of about 3 nm continuously with the TiSiN film 7 by the PVD process (sputtering process) without being opened to the atmosphere.

By the above-described steps, the first to third barrier metal films 6, 7, 8 constituting the barrier metal film 11 having a three-layer structure according to the present embodiment are successively stacked and provided in the recess 5 for the conductive layer. Concretely, the respective barrier metal films 6, 7, 8 are continuously formed in vacuum. Therefore, any oxide layer is not formed in the respective barrier metal films 6, 7, 8.

Figure 3A:
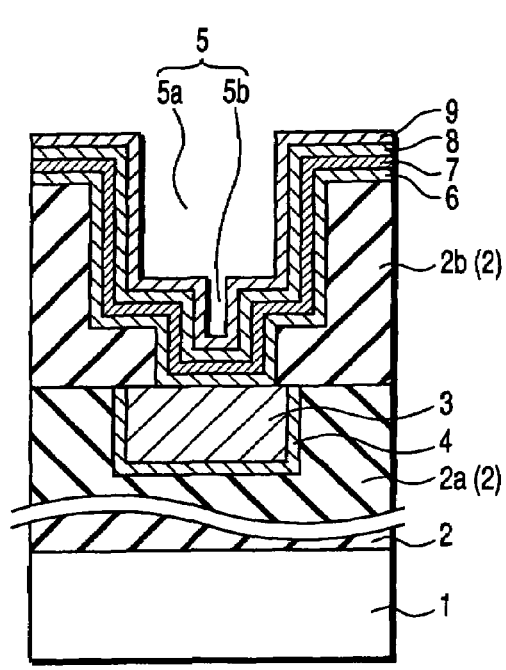
FIGS. 3A and 3B are process sectional views showing the method of manufacturing the semiconductor device according to the first embodiment.

Next, as shown in FIG. 3A, the first Cu film 9 is provided on the surface of the third barrier metal film (Ti film) 8 which is a metal layer. This first Cu film 9 constitutes a seed layer (underlayer) for providing the second Cu film 10 described layer. The first Cu film (seed Cu film, Cu base film) 9 is formed into a thin film continuously to the Ti film 8 by the PVD process (sputtering process) without being opened to the atmosphere. That is, the first Cu film 9 is formed in vacuum continuously to the first to third barrier metal films 6, 7, 8. It is to be noted that the temperature of the semiconductor substrate 1 may be set at 25° C. or more in forming the first Cu film 9 as described later.

Figure 3B:
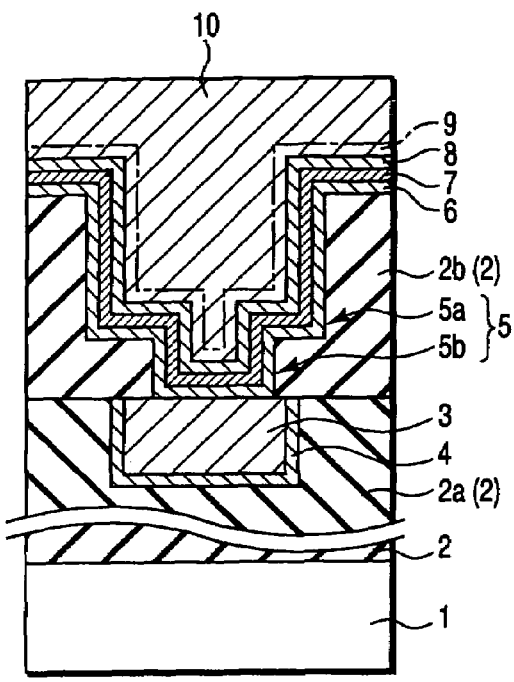

Next, as shown in FIG. 3B, the second Cu film 10 is provided on the surface of the first Cu film 9. The second Cu film 10 constitutes a Cu conductive layer main body which is a main portion of the Cu conductive layer. The second Cu film 10 is formed on the surface of the first Cu film 9 by the plating process, whereas the first Cu film constituting an underlayer of the second Cu film is formed as a seed layer. Concretely, the Cu plating film 10 which is the second Cu film is integrated, plated, and grown on the seed Cu film 9 until a film thickness of the Cu plating film together with the seed Cu film 9 reaches about 800 nm. Accordingly, the conductive layer recess 5 constituted of the wiring groove 5a and the via hole 5b is filled with the first to third barrier metal films 6, 7, 8, the seed Cu film 9, and the Cu plating film 10. After finishing the filling-in of the conductive layer recess 5, heating temperature is set at about 150° C., heating time is set to about 60 minutes, and the inter level dielectric 2b and the respective films 6 to 10 are subjected to the annealing process.

Figure 4A:
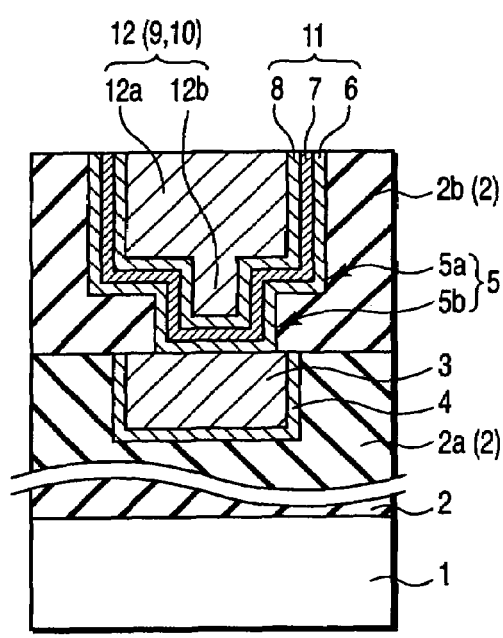
FIGS. 4A and 4B are process sectional views showing the method of manufacturing the semiconductor device according to the first embodiment.

Next, as shown in FIG. 4A, the unnecessary first to third barrier metal films 6, 7, 8, seed Cu film 9, and Cu plating film 10 outside the conductive layer recess 5 are removed. Concretely, the respective films 6 to 10 on the inter level dielectric 2b are subjected to a CMP treatment, and accordingly polished and removed. Accordingly, the first to third barrier metal films 6, 7, 8, the seed Cu film 9, and the Cu plating film 10 are left only inside the recess 5 for the conductive layer. That is, the Cu conductive layer 12 constituted of the dual damascene structure in which the Cu wire 12a is formed integrally with the Cu via plug 12b is coated with the barrier metal film 11 constituted of the three-layer structure of the first to third barrier metal films 6, 7, 8, and provided in the recess 5 for the conductive layer. In the following description, the Cu conductive layer 12 will be referred to as the Cu dual damascene wire 12.

Figure 4B:
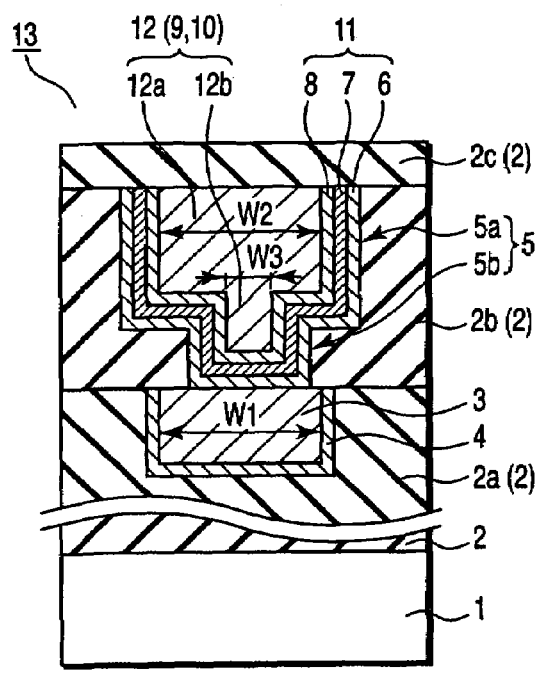

Next, as shown in FIG. 4B, the barrier metal film 11 and the Cu dual damascene wire 12 are coated, and an inter level dielectric (upper-layer insulating film) 2c of an n+1-th layer is provided on the surface of the inter level dielectric 2b of the n-th layer by the CVD process. Thereafter, a desired semiconductor device 13 having a wiring structure shown in FIG. 4B is obtained through predetermined steps. That is, the semiconductor device 13 of the present embodiment having a Cu stacked wiring structure of two layers constituted of the lower-layer Cu wire 3 and the Cu dual damascene wire 12 is obtained as a Cu multilayered wiring structure.

Next, several experiments and results performed by the present inventors in order to check reliability, quality, electric characteristic and the like of the semiconductor device manufactured by the method of manufacturing the semiconductor device according to the present embodiment described above will be described with reference to FIGS. 5A to 12.

First, an experiment in which aggregation of Cu in the seed Cu film was checked, and results will be described with reference to FIGS. 5A to 7C. This experiment was performed in order to check adhesion of the barrier metal film to the seed Cu film (seed Cu layer) provided on the surface of the barrier metal film. Concretely, aggregation state of Cu in the seed Cu film on the barrier metal film in a case where the barrier metal film was opened to the atmosphere was compared with that in a case where the film was not opened to the atmosphere before forming the seed Cu film. The present inventors prepared first to third samples 14, 101, 102 as described below in performing this Cu aggregation test.

First, the first sample 14 shown in FIGS. 5A to 5C was formed up to the seed Cu film 9 in the same manner as in the above-described method of manufacturing the semiconductor device according to the present embodiment. Concretely, first a solid PVD-Ti film corresponding to a first barrier metal film, a solid CVD-TiSiN film corresponding to a second barrier metal film, and a solid PVD-Ti film corresponding to a third barrier metal film were continuously provided on a solid SiO$_2$ film corresponding to an inter level dielectric in vacuum. Subsequently, a solid PVD-seed Cu film 9 was continuously provided on the PVD-Ti film in vacuum. Thus, the first sample 14 has a structure in which the respective solid films including the PVD-Ti film, CVD-TiSiN film, PVD-Ti film, and PVD-seed-cu film 9 continuously formed without being exposed (opened) to the atmosphere are stacked and provided on the solid SiO$_2$ film. This structure will be referred to as SiO$_2$ film/PVD-Ti film/CVD-TiSiN film/PVD-Ti film/PVD-seed-Cu film 9. It is to be noted that in the previous sentence, "/" indicates that there is not any atmosphere exposure in forming previous/subsequent films. In the photographs shown in FIGS. 5A to 5C, the barrier metal film 11 in which the PVD-Ti film/CVD-TiSiN film/PVD-Ti film are integrated, and the PVD-seed-Cu film 9 in the above-described structure are shown, and the SiO$_2$ film is not shown. This first sample 14 represents a first example according to the present embodiment.

Figure 6A:
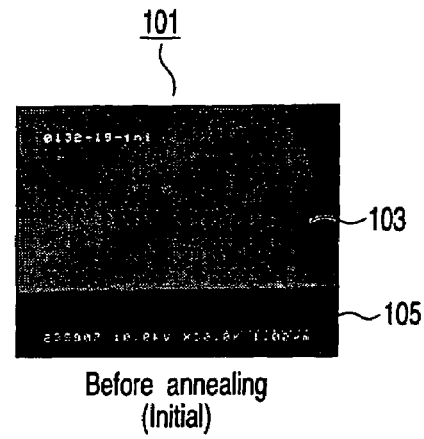
FIGS. 6A to 6C are photographs showing the dependence, on the temperature, of the surface state of the Cu seed layer provided by the method of manufacturing the semiconductor device according to one mode of a background technique which is a comparative example with respect to the first embodiment.
Figure 6B:
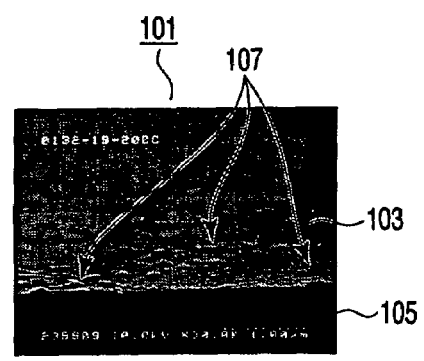
Figure 6C:
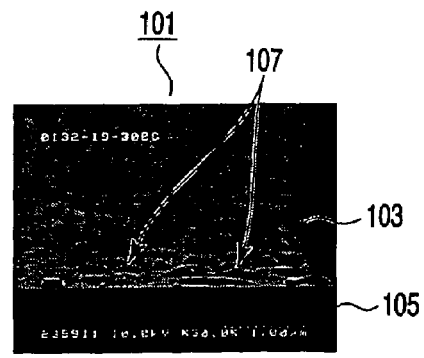

Next, the second sample 101 shown in FIGS. 6A to 6C was formed up to the PVD-Ti film which was the third barrier metal film in a method similar to the above-described method of manufacturing the semiconductor device according to the present embodiment. Concretely, first, a solid PVD-Ti film corresponding to the first barrier metal film, a solid CVD-TiSiN film corresponding to the second barrier metal film, and a solid PVD-Ti film corresponding to the third barrier metal film were continuously provided on a solid SiO$_2$ film corresponding to the inter level dielectric in vacuum. Subsequently, the PVD-Ti film corresponding to the third barrier metal film was exposed to the atmosphere to form an oxide layer in a surface layer portion before forming a PVD-seed-Cu film 103. Thereafter, a solid PVD-seed-Cu film 103 was provided on the PVD-Ti film on which the oxide layer was formed in vacuum. That is, the second sample 101 has substantially the same structure as that of the first sample 14 except that the PVD-seed-Cu film 103 is formed on the PVD-Ti film exposed to the atmosphere. This structure will be referred to as $SiO_2$ film/PVD-Ti film/CVD-TiSiN film/PVD-Ti film//PVD-seed-Cu film 103. It is to be noted that "//" in the previous sentence indicates that there is atmosphere exposure in forming previous/subsequent films. In the photographs shown in FIGS. 6A to 6C, a barrier metal film 105 in which the PVD-Ti film/CVD-TiSiN film/PVD-Ti film are integrated, and the PVD-seed-Cu film 103 are shown, and any $SiO_2$ film is not shown. This second sample 101 is a first comparative example with respect to the first sample 14 which is the first example according to the present embodiment.

Moreover, the third sample 102 shown in FIGS. 7A to 7C was prepared by a method substantially similar to a method of manufacturing a semiconductor device described in the background technique. Concretely, first, a solid PVD-Ta film 104 corresponding to a barrier metal film was provided on a solid $SiO_2$ film corresponding to an inter level dielectric in vacuum. Subsequently, a solid PVD-seed-Cu film 106 was continuously provided on the PVD-Ta film 104 in vacuum without being opened to the atmosphere. Thus, the third sample 102 has a structure in which the respective solid PVD-Ta film 104 and PVD-seed-Cu film 106 continuously formed without being exposed to the atmosphere are stacked and provided on the solid $SiO_2$ film. This structure will be referred to as $SiO_2$ film/PVD-Ta film 104/PVD-seed-Cu film 106. In the photographs shown in FIGS. 7A to 7C, the PVD-Ta film 104 and the PVD-seed-Cu film 106 in the structure are shown, and any $SiO_2$ film is not shown. This third sample 102 is a second comparative example with respect to the first sample 14 which is the first example according to the present embodiment.

In this test, first, each of the above-described first to third samples 14, 101, 102 was annealed at about 200° C. and 300° C. for about one hour. Thereafter, the surfaces of the respective PVD-seed-Cu films 9, 103, 106 of the annealed samples 14, 101, 102 were observed by SEM. Moreover, the surfaces of the PVD-seed-Cu films 9, 103, 106 of the samples 14, 101, 102 which were not annealed were observed by the SEM. In general, as adhesions of the respective barrier metal films (PVD-TI film, PVD-Ta film) to the PVD-seed-Cu films 9, 103, 106 weaken, Cu of the respective PVD-seed-Cu films 9, 103, 106 easily aggregates by the annealing. FIGS. 5A to 7C show results of the observation of the surfaces of the samples 14, 101, 102 by the SEM before the annealing, after the annealing at about 200° C., and after the annealing at about 300° C.

As shown in FIGS. 5A to 5C, in the first sample 14 prepared by the method of manufacturing the semiconductor device according to the present embodiment, the aggregation of Cu on the PVD-seed-Cu film 9 was hardly observed in any state before the annealing, or after the annealing at about 200° C. or 300° C.

Moreover, as shown in FIG. 6A, in the second sample 101 in which the PVD-Ti film was exposed to the atmosphere, and thereafter the PVD-seed-Cu film 103 was formed, the aggregation of Cu on the PVD-seed-Cu film 103 was hardly observed before the annealing. However, as shown in FIG. 6B, the aggregation of Cu was partially observed on the PVD-seed-Cu film 103 after the annealing at about 200° C. Furthermore, as shown in FIG. 6C, after the annealing at about 300° C., aggregations 107 of Cu were substantially entirely scattered and observed on the PVD-seed-Cu film 103. The aggregated portion 107 of Cu generated by the annealing at about 300° C. was larger than that of Cu generated by the annealing at about 200° C.

Moreover, as shown in FIGS. 7A and 7B, in the third sample 102 prepared by the method of manufacturing the semiconductor device according to the background technique, the aggregation of Cu was hardly observed on the PVD-seed-Cu film 106 before the annealing and after the annealing at about 200° C. However, as shown in FIG. 7C, after the annealing at about 300° C., aggregations 108 of Cu were substantially entirely scattered and observed on the PVD-seed-Cu film 106. The aggregated portion 108 of Cu generated by the annealing of the third sample 102 at about 300° C. was remarkably larger as compared with the aggregated portion 107 of Cu generated by the annealing of the second sample 101 shown in FIG. 6C at about 300° C.

By the result of the aggregation test of Cu, the following has been found. When the PVD-Ti film (third barrier metal film) and the PVD-seed-Cu film 9 are continuously formed without being exposed to the atmosphere, as shown in FIG. 5C, Cu does not aggregate even by the annealing of the PVD-seed-Cu film 9 at about 300° C. By an additional test performed by the present inventors although not shown, when the PVD-Ti film and the PVD-seed-Cu film 9 are continuously formed without being exposed to the atmosphere, Cu does not aggregate even by the annealing of h of the PVD-seed-Cu film 9 at about 450° C.

Moreover, the first sample 14 in which the PVD-Ti film and the PVD-seed-Cu film 9 were continuously formed without being exposed to the atmosphere as shown in FIGS. 5A to 5C was compared with the third sample 102 in which the PVD-Ta film and the PVD-seed-Cu film 106 were continuously formed without being exposed to the atmosphere as shown in FIGS. 7A to 7C. Then, as shown in FIGS. 5A and 5B, and FIGS. 7A and 7B, both in the first sample 14 and the third sample 102, Cu did not aggregate even by the annealing at about 200° C. However, when the first and third samples 14, 102 are annealed at about 300° C., as shown in FIG. 5C, Cu does not aggregate in the first sample 14. However, aggregation 108 of Cu occurs in the third sample 102 as shown in FIG. 7C. That is, it has been found that occurrence temperature of aggregation of Cu differs with difference of a material of the underlayer even in a case where the PVD-seed-Cu film and the underlayer are continuously formed by the PVD process without being exposed to the atmosphere. It is supposed that the difference of the material of the underlayer or the film forming process results in the difference of the result in each test for checking reliability (resistance) of the Cu wire (Cu conductive layer) with respect to sinter, SIV, or EM described later.

Furthermore, as apparent from FIGS. 6A to 6C, even in a case where the PVD-seed-Cu film 103 is formed on the PVD-Ti film, when the PVD-Ti film is exposed to the atmosphere before forming the PVD-seed-Cu film 103, Cu gradually aggregates at about 200° C. From this result, it has been found that when the oxide layer is formed in the surface layer portion of the PVD-Ti film, the adhesion of the PVD-Ti film to the PVD-seed-Cu film 103 is deteriorated (lowered). Additionally, it is expected that the reliability of the semiconductor device having the wiring formed by forming the Cu film on the Ti film including the oxide layer formed in the surface layer portion is deteriorated.

In Jpn. Pat. Appln. KOKAI Publication No. 2001-244265 described above in the background technique, a technique of providing a Ti oxide layer between a CVD or ALD film and a seed Cu film has been described in order to improve low adhesion of the Cu wire to the CVD or ALD film. In this technique, the barrier metal film and the seed Cu film are formed by a method similar to that of the above-described second sample. Concretely, the Ti film is formed on the CVD or ALD film before forming the seed Cu film. Subsequently, the Ti film is exposed to the atmosphere to thereby form the Ti oxide layer in the surface layer portion of the Ti film. Thereafter, the seed Cu film is formed on the Ti oxide layer. Accordingly, the adhesion of the barrier metal film constituted of the CVD or ALD film to the seed Cu film is enhanced, and the reliability of the Cu wire, that is, the reliability of the semiconductor device or the like is improved.

Additionally, according to the present experiment performed by the present inventors, as apparent from FIGS. 6A to 6C, when the oxide layer exists in an interface between the Ti film and the seed Cu film by the opening to the atmosphere, it is hardly possible to inhibit the aggregation of Cu. That is, it has been found that it is remarkably difficult to improve degree of reliability deterioration of the semiconductor device.

It is to be noted that in FIGS. 5A to 7C, test results (data) are shown in a case where the annealing temperature with respect to each of the PVD-seed-Cu films 9, 103, 106 is set at about 200° C. or 300° C. On the other hand, as described in the background technique, the annealing is generally performed at high temperature of 350° C. or more after forming the PVD-seed-Cu film constituting the Cu wire. On the other hand, as described above, in the first sample 14 according to the present embodiment, even if the annealing temperature is raised at about 450° C., Cu does not aggregate. The annealing is possible even at high temperature of about 450° C. That is, the first sample 14 has resistance (reliability) capable of holding a film quality of the PVD-seed-Cu film in an appropriate state even at high temperature of about 450° C.

Moreover, in the above-described first to third samples 14, 101, 102, the solid Cu film having a film thickness of about 10 nm was used in common in each of the PVD-seed-Cu films 9, 103, 106. The film thickness of about 10 nm in each of the PVD-seed-Cu films 9, 103, 106 is not a value set for a purpose of use in an actual semiconductor device. In general, as the Cu film becomes thin, Cu easily aggregates. Therefore, each of the PVD-seed-Cu films 9, 103, 106 is formed into a small film thickness of about 10 nm in order to accelerate aggregation of Cu and facilitate comparison of aggregated states of Cu among the respective PVD-seed-Cu films 9, 103, 106.

Thus, this first experiment is an absolutely acceleration experiment in which each of the PVD-seed-Cu films 9, 103, 106 is formed into a thin film in a Cu easily aggregated state (accelerated state). That is, the experiment is performed for a purpose of easily comparing aggregated states of Cu in the respective PVD-seed-Cu films 9, 103, 106 provided on various barrier metal films formed by various materials or film forming processes.

Secondly, an experiment in which an electric characteristic in the Cu conductive layer was checked, and results will be described with reference to FIGS. 8 and 9. This experiment was performed in order to verify that there was little possibility of resistance value rise in a main portion of the Cu conductive layer by Ti/Cu reaction, even when any oxide layer was not formed in the surface layer portion of the Ti film directly contacting the Cu conductive layer. Concretely, for example, temperature of the annealing for recovering damages on the inter level dielectric including the Cu conductive layer provided by CMP in forming the Cu conductive layer, that is, sintering temperature was raised at about 400° C. from usual temperature of about 370° C., and sintering was performed. Accordingly, reaction (Ti/Cu reaction) was caused between the Ti film and the Cu conductive layer, and an influence of the reaction on the resistance value in the main portion of the Cu conductive layer was estimated. To perform the sintering (sinter test), the present inventors prepared fourth and fifth samples.

First, although not shown, the fourth sample was prepared by the method of manufacturing the semiconductor device according to the background technique in the same manner as in the third sample 102 used in the above-described Cu aggregation test. That is, first a PVD-TaN film was provided as a lower-layer barrier metal film in a recess formed in the inter level dielectric in vacuum. Subsequently, a PVD-Ta film was continuously stacked and provided as an upper-layer barrier metal film on the PVD-TaN film without being opened to the atmosphere in vacuum. Furthermore, the seed Cu film was continuously stacked and provided on the PVD-Ta film in vacuum by a PVD process without being opened to the atmosphere. Thus, the fourth sample has a barrier metal film having a two-layer structure constituted of the PVD-TaN film/PVD-Ta film continuously formed without being exposed to the atmosphere. It is to be noted that each of the PVD-TaN film and the PVD-Ta film was formed into a film thickness of about 10 nm. This fourth sample is a third comparative example with respect to the fifth sample which is a second example of the present embodiment as described layer.

Next, the fifth sample was prepared by the method of manufacturing the semiconductor device according to the present embodiment in the same manner as in the first sample 14 used in the above-described Cu aggregation test. That is, first a PVD-Ti film was provided as the lower-layer barrier metal film in the recess formed in the inter level dielectric in vacuum. Subsequently, a CVD-TiSiN film was continuously stacked and provided as an intermediate barrier metal film on the PVD-Ti film in vacuum without being opened to the atmosphere. Subsequently, a PVD-Ti film was continuously stacked and provided as an upper-layer barrier metal film on the CVD-TiSiN film in vacuum without being opened to the atmosphere. Furthermore, a seed Cu film was continuously stacked and provided on the PVD-Ti film in vacuum by the PVD process without being opened to the atmosphere. Thus, the fifth sample has a barrier metal film having a three-layer structure constituted of the PVD-Ti film/CVD-TiSiN film/PVD-Ti film continuously formed without being exposed to the atmosphere. It is to be noted that each of the PVD-Ti films of the upper and lower layers is formed into a film thickness of about 6 nm. Moreover, the CVD-TiSiN film was formed into a film thickness of about 3 nm. The film thickness of each PVD-Ti film is set to about 6 nm which is thicker than usual, and accordingly the Ti/Cu reaction can be measured with good sensitivity. This fifth sample is a second example according to the present embodiment.

It is to be noted that in each of the fourth and fifth samples described above, the structure of the Cu conductive layer is set to be common in order to facilitate the comparison of test results. Concretely, the structure of the Cu conductive layer of each of the fourth and fifth samples was formed into the dual damascene structure similar to that of the semiconductor device 13 shown in FIG. 4B. Moreover, the Cu conductive layer 12 was electrically connected to the lower Cu conductive layer 3 to form a two-layer wiring structure. Furthermore, a width of a Cu wire 12a shown by a solid-line arrow W2 in FIG. 4B was set to about 0.14 µm in the Cu conductive layer 12. A length of the Cu wire 12a was set to about 1.7 mm.

Furthermore, a diameter of a Cu via plug 12b shown by a solid-line arrow W3 in FIG. 4B was set to about 0.14 μm in the Cu conductive layer 12.

In this test, the above-described fourth sample was sintered at about 370° C. for a predetermined time. This test is assumed as (A). The above-described fifth sample was sintered at two temperatures of about 370° C. and 400° C. for a predetermined time. Here, a test in which the fifth sample was sintered at about 370° C. is assumed as (B). A test in which the fifth sample was sintered at about 400° C. is assumed as (C). The heating temperature at about 400° C. is a so-called acceleration condition for activating reaction between the Ti film and the Cu conductive layer. Thus, after sintering the fourth and fifth samples at about 370° C. or 400° C., the resistance values in a wiring portion and via plug of each sample were measured. This process was performed a plurality of times. Results are shown in FIGS. 8 and 9.

As shown in FIG. 8, a maximum value of wiring resistance was highest in (A). Moreover, a fluctuation of a measured value of the wiring resistance was largest in (A). On the other hand, the maximum value of the wiring resistance was lowest in (B). Moreover, the fluctuation of the measured value of the wiring resistance was also smallest in (B). Both the maximum value of the wiring resistance and the fluctuation of the measured value of the wiring resistance in (C) indicated intermediate values between (A) and (B).

Moreover, as shown in FIG. 9, the maximum value of a via plug resistance was highest in (A). However, the fluctuation of the measured value of the via plug resistance of (A) indicated an intermediate value between (B) and (C). On the other hand, the maximum value of the via plug resistance was lowest in (C). Moreover, the fluctuation of the measured value of the via plug resistance was also smallest in (C). The maximum value of the via plug resistance of (B) was between (A) and (C).

Thus, according to the present embodiment, it has been found that when temperature (heat history) in heating the Cu conductive layer and the barrier metal film is set to about 400° C. or less, the resistance values in the wiring portion and the via plug can be suppressed at sufficiently low values as compared with a conventional technique. That is, when the PVD-Ti film/CVD-TiSiN film/PVD-Ti film/seed Cu film are continuously formed without being exposed to the atmosphere, the Ti/Cu reaction can be inhibited without forming any oxide layer in the surface layer portion of the Ti film directly contacting the Cu conductive layer. As a result, the rise of the resistance value attributable to the Ti/Cu reaction can be substantially eliminated in main portions of the Cu conductive layer, such as a Cu wiring portion and a Cu via plug.

Thirdly, an experiment in which resistance (reliability) of the Cu conductive layer with respect to stress induced voiding (SIV) was checked, and results will be described with reference to FIG. 10. To perform this SIV test, the present inventors roughly prepared the following two, sixth and seventh samples.

First, although not shown, the sixth sample was prepared in substantially the same two-layer wiring structure as that of the fourth sample used in the above-described sinter test by the method of manufacturing the semiconductor device according to the background technique. That is, in the sixth sample, each of the respective barrier metal films of the PVD-TaN film and PVD-Ta film was formed into a film thickness of about 10 nm without being opened to the atmosphere. The diameter of the Cu via plug shown by a solid-line arrow W3 in FIG. 4B was set to about 0.14 μm. Additionally, the width of the lower-layer Cu wire shown by a solid-line arrow W1 in FIG. 4B, and the width of the Cu wire shown by a solid-line arrow W2 in FIG. 4B were set to six different sizes of about 0.42 μm, 1 μm, 2 μm, 5 μm, 10 μm, and 25 μm, and combined. Concretely, as shown in FIG. 10, the combination of the width W1 of the lower-layer Cu wire with the width W2 of the Cu wire was changed to thereby prepare seven types of sixth samples (1) to (7). These seven types of sixth samples are fourth comparative examples with respect to a seventh sample which is a third example of the present embodiment as described later.

Next, the seventh sample was prepared substantially in the same two-layer wiring structure as that of the fifth sample used in the above-described sinter test by the method of manufacturing the semiconductor device according to the present embodiment using a CVD-TiSiN film as an intermediate barrier metal film. For example, a diameter W3 of the Cu via plug 12b was set to about 0.14 μm. Additionally, in the seventh sample, each of the PVD-Ti film, CVD-TiSiN film, and PVD-Ti film was formed into a film thickness of about 3 nm without being opened to the atmosphere. The width W1 of the lower-layer Cu wire 3, and the width W2 of the Cu wire 12a were set to six different sizes of about 0.42 μm, 1 μm, 2 μm, 5 μm, 10 μm, and 25 μm, and combined in the same manner as in the above-described sixth sample. Concretely, as shown in FIG. 10, the combination of the width W1 of the lower-layer Cu wire with the width W2 of the Cu wire was changed to thereby prepare seven types of seventh samples (8) to (14). These seven types of seventh samples are third examples according to the present embodiment.

In this SIV test, the diameter W3 of the via plug of each of the above-described sixth and seventh samples was set to about 0.14 μm, the width W1 of the lower-layer Cu wire and the width W2 of the Cu wire were changed, and tendency of defect occurrence ratio by stress was checked. In this case, first each of the sixth and seventh samples was held at a temperature of about 225° C. in a constant temperature bath (not shown) for about 1000 hours. Thereafter, an evaluation pattern obtained by combining the lower-layer Cu wire and the Cu wire having the wiring widths W1, W2 set in a range of 0.42 μm to 25 μm was measured. Here, an SIV test performed with respect to seven types of sixth samples (1) to (7) is assumed as (D). An SIV test performed with respect to seven types of seventh samples (8) to (14) is assumed as (E). Test results of these SIV tests (D) and (E) are shown in FIG. 10.

In general, since the wiring width broadens, large stress is applied. Therefore, it is known that the defect occurrence ratio rises. As shown in FIG. 10, in the samples (6) and (13), and the samples (7) and (14), the width W1 of the lower-layer Cu wire, and the width W2 of the Cu wire were absolutely set to mutually different sizes unlike the other samples. By this setting, it was verified whether the defect by SIV was attributable to the width W1 of the lower-layer Cu wire or the width W2 of the Cu wire.

As apparent from the graph shown in FIG. 10, in the SIV test (D), the defect occurrence ratio increased in the sample (5) in which both the width W1 of the lower-layer Cu wire and the width W2 of the Cu wire were 25 μm. On the other hand, it has been found that in the SIV test (E), the defect occurrence ratio is remarkably small even in the sample (12) in which both the width W1 of the lower-layer Cu wire and the width W2 of the Cu wire are 25 μm. Further in the SIV test (D), the defect occurrence ratio was almost 0 in the samples (3), (4), and (7) among the samples (1) to (7). On the other hand, in the SIV test (E), the defect occurrence ratio was almost 0 in all the samples excluding the above-described (12) among the samples (8) to (14). By this result, it has been found that the defect occurrence ratio by the resistance rise can be largely reduced regardless of the width W1 of the lower-layer Cu wire or the width W2 of the Cu wire according to the present embodiment as compared with the conventional technique. That is, according to the present embodiment, the SIV reliability (SIV resistance) can be largely enhanced as compared with the conventional technique.

Moreover, in the SIV test (D), the defect occurrence ratio was almost 0 in the sample (7) in the samples (6) and (7) in which the width W1 of the lower-layer Cu wire and the width W2 of the Cu wire were absolutely set to mutually different sizes. On the other hand, in the SIV test (E), the defect occurrence ratio was almost 0 in both the samples (13) and (14) in which the width W1 of the lower-layer Cu wire and the width W2 of the Cu wire were similarly absolutely set to mutually different sizes. By this result, it has been found that the defect caused by the SIV is attributable to the size of the width W2 of the Cu wire rather than that of the width W1 of the lower-layer Cu wire. Moreover, according to the additional test performed by the present inventors, it has been found that when exposing the barrier metal film directly contacting the seed Cu film to the atmosphere before forming the seed Cu film, the defect occurrence ratio largely rises in all the sixth samples (1) to (7), and all the seventh samples (8) to (14). That is, it has been found that when exposing the barrier metal film directly contacting the seed Cu film to the atmosphere before forming the seed Cu film, the defect occurrence ratio by the SIV largely rises regardless of the structure or film quality of the barrier metal film.

Fourthly, an experiment in which the resistance in the Cu conductive layer with respect to the SIV was checked, and results will be described with reference to FIG. 11 in the same manner as in the above-described third test. To perform this SIV test, the present inventors roughly prepared two, eighth and ninth samples as described below.

First, although not shown, the eighth sample was prepared in the same two-layer wiring structure as that of the sixth sample used in the SIV test by the method of manufacturing the semiconductor device according to the background technique. That is, as shown in FIG. 11, even in this eighth sample, the width W1 of the lower-layer Cu wire, and the width W2 of the Cu wire were set to six different sizes of about 0.42 µm, 1 µm, 2 µm, 5 µm, 10 µm, and 25 µm, and combined. That is, the width W1 of the lower-layer Cu wire and the width W2 of the Cu wire were changed and combined in a range of about 0.42 µm to 25 µm to thereby prepare seven types of eighth samples (15) to (21) having the same setting as that of the sixth sample. Even in the seven types of eighth samples (15) to (21), the diameter W3 of the Cu via plug was set to about 0.14 µm in the same manner as in the sixth sample. These seven types of eighth samples are fifth comparative examples with respect to a ninth sample which is a fourth example according to the present embodiment as described later.

Next, the ninth sample was prepared in substantially the same two-layer wiring structure as that of the seventh sample used in the above-described SIV test by the method of manufacturing the semiconductor device according to the present embodiment using an ALD-TaN film as an intermediate barrier metal film. That is, in the ninth sample, the PVD-Ti film, ALD-TaN film, and PVD-Ti film were continuously formed without being opened to the atmosphere. As shown in FIG. 11, even in this ninth sample, the width W1 of the lower-layer Cu wire, and the width W2 of the Cu wire were set to six different sizes of about 0.42 µm, 1 µm, 2 µm, 5 µm, 10 µm, and 25 µm, and combined. That is, the width W1 of the lower-layer Cu wire and the width W2 of the Cu wire were changed and combined in a range of about 0.42 µm to 25 µm to thereby prepare seven types of ninth samples (22) to (28) having the same setting as that of the seventh sample. Even in the seven types of ninth samples (22) to (28), the diameter W3 of the Cu via plug 12b was set to about 0.14 µm in the same manner as in the seventh sample. Additionally, unlike the seventh sample, the only ALD-TaN film which was the intermediate barrier metal film was formed into a film thickness of about 1 nm in the ninth sample. These seven types of ninth samples are fourth example according to the present embodiment.

This fourth SIV test was performed with substantially the same setting as that of the above-described third SIV test. Additionally, a heating time was set to about 500 hours which were the half of the time of the third SIV test. Here, an SIV test performed with respect to seven types of eighth samples (15) to (21) is assumed as (F). An SIV test performed with respect to seven types of ninth samples (22) to (28) is assumed as (G). Test results of these SIV tests (F) and (G) are shown in FIG. 11.

As apparent from the graph shown in FIG. 11, it has been found that an effect similar to that in a case where the above-described CVD-TiSiN film is used, even when the ALD-TaN film is used in the intermediate barrier metal film. That is, even when the ALD-TaN film is used in the intermediate barrier metal film, the SIV reliability can be largely enhanced as compared with the conventional technique. Furthermore, according to an additional test performed by the present inventors, when exposing the barrier metal film directly contacting the seed Cu film to the atmosphere before forming the seed Cu film, the defect occurrence ratio largely rose in all the eighth samples (15) to (21), and all the ninth samples (22) to (28). That is, it has been found that the defect occurrence ratio by the SIV largely rises regardless of the structure or film quality of the barrier metal film, when exposing the barrier metal film directly contacting the seed Cu film to the atmosphere before forming the seed Cu film.

Thus, it has been apparent from the results of the third and fourth SIV tests that, according to the present embodiment, the SIV resistance can be enhanced equally or more as compared with the background technique.

Fifthly, an experiment in which resistance of the Cu conductive layer with respect to electro migration (EM) was checked, and results will be described with reference to FIG. 12. To perform this EM test, the present inventors prepared two, tenth and eleventh samples as described below.

First, although not shown, in the tenth sample, the barrier metal film was formed by a manufacturing method similar to the method of manufacturing the semiconductor device according to the background technique. Another part is similar to that of the semiconductor device 13 according to the present embodiment shown in FIG. 4B. This tenth sample is a sixth comparative example with respect to the eleventh sample which is a fifth example according to the present embodiment as described later. Next, the eleventh sample was manufactured by the method of manufacturing the semiconductor device according to the present embodiment. This eleventh sample is the fifth example according to the present embodiment. In these tenth and eleventh samples, the width W2 of the Cu wire and the diameter W3 of the Cu via plug were both set to about 0.15 µm.

This fifth EM test was performed on conditions that retaining temperature of each of the tenth and eleventh samples was set to about 325° C., and current density of current passed through the Cu wire of each of the tenth and eleventh samples was set to about 2 MA/cm$^2$. Results of the EM test of the evaluation pattern having a wiring width of about 0.15 µm on the conditions are shown in FIG. 12.

As apparent from the graph shown in FIG. 12, time to failure (TTF) by EM lengthens about ten times or more in the eleventh sample according to the present embodiment as compared with the tenth sample according to the background technique. That is, it has been found that EM resistance (TTF) can be enhanced by one digit according to the present embodiment as compared with the background technique. According to researches performed by the present inventors, it has been apparent that large elongation of TTF is an effect by the result of enhancement of the adhesion of the Cu film to the Ti film which is a barrier metal film of an uppermost layer. Furthermore, according to an additional test performed by the present inventors, the graph shown in FIG. 12 shifts to the left side in both of the tenth and eleventh samples, when exposing the barrier metal film directly contacting the seed Cu film to the atmosphere before forming the seed Cu film. That is, it has been found that the TTF by the EM shortens regardless of the structure or the film quality of the barrier metal film, when exposing the barrier metal film directly contacting the seed Cu film to the atmosphere before forming the seed Cu film.

As described above, according to the first embodiment, the first barrier metal film (PVD-Ti film) 6, the second barrier metal film (CVD-TiSiN film) 7, and the third barrier metal film (PVD-Ti film) 8 are continuously formed and stacked in the recess 5 for the conductive layer, formed in the inter level dielectric 2b of the n-th layer on the semiconductor substrate 1 without being opened to the atmosphere. Moreover, the seed Cu film (PVD-seed-Cu film) 9 is continuously provided on the third barrier metal film 8 without being opened to the atmosphere. Thereafter, the Cu plating film 10 is plated and grown on the seed Cu film 9 to fill in the recess 5. Accordingly, the Cu conductive layer 12 having the dual damascene structure coated with the barrier metal film 11 constituted of the three-layer structure of the first to third barrier metal films 6, 7, 8 is formed in the inter level dielectric 2b of the n-th layer.

According to the constitution, since the PVD-Ti film 6 is provided between the inter level dielectric 2b and the CVD-TiSiN film 7 sensitive to the material or type of the base, the CVD-TiSiN film 7 having a uniform quality can be stably formed. Since the PVD-Ti film 8 is provided between the CVD-TiSiN film 7 and the Cu conductive layer 12 (PVD-seed-Cu film 9), the adhesion of the Cu conductive layer 12 to the barrier metal film 11 (PVD-Ti film 8) is enhanced. That is, the film quality and film forming property of the barrier metal film 11 coating the Cu conductive layer 12 and buried in the inter level dielectric 2b, and the adhesion of the Cu conductive layer 12 to the barrier metal film 11 can be improved. As a result, the reliability, electric characteristic and the like of the Cu conductive layer 12 can be enhanced. Moreover, it is possible to efficiently and easily manufacture the semiconductor device 13 in which the Cu conductive layer 12 is provided to thereby enhance the reliability, electric characteristic and the like. This also applies to the ninth sample according to the fourth example of the present embodiment in which the ALD-TaN film formed by the ALD process is used as the intermediate barrier metal film.

Concretely, since the adhesion of the Cu conductive layer 12 to the barrier metal film 11 is enhanced, there is hardly possibility that Cu atoms and vacancies in the Cu conductive layer 12 or the lower-layer Cu wire 3 move along the interface between the Cu conductive layer 12 and the barrier metal film 11, even when the Cu conductive layer 12 is heated at high temperature. That is, there is little possibility that voids are formed in the Cu conductive layer 12 or the lower-layer Cu wire 3 and that the reliability, quality, electric characteristic and the like of the Cu conductive layer 12 or the lower-layer Cu wire 3 drop. Additionally, there is little possibility that the voids are formed in the Cu conductive layer 12 or the lower-layer Cu wire 3 and that accordingly the reliability, quality, performance, yield and the like of the semiconductor device 13 drop.

Moreover, since the adhesion of the Cu conductive layer 12 (seed Cu film 9) to the barrier metal film 11 is enhanced, Cu hardly aggregates, even when the semiconductor substrate 1 is held at a temperature of about 25° C. or more in providing the seed Cu film 9. Therefore, when the semiconductor substrate 1 is held at a temperature of about 25° C. or more in providing the seed Cu film 9, a satisfactory-quality seed Cu film can be efficiently formed utilizing surface diffusion phenomenon of Cu. Accordingly, coverage of the inside of the via hole 5b by the seed Cu film 9 can be enhanced. Additionally, the growth of an overhang portion in the opening of the wiring groove 5a by the seed Cu film 9 can be substantially eliminated. As a result, troubles in plating/growing the Cu plating film 10 to fill in the recess 5 (wiring groove 5a, via hole 5b) for the conductive layer can be substantially eliminated.

Moreover, as described above, there is little possibility that the void or the aggregation of Cu is generated in the Cu conductive layer 12, even when the Cu conductive layer 12 is heated at high temperature. Therefore, the formed Cu conductive layer 12 can be annealed at high temperature. Accordingly, crystal grain growth in the Cu conductive layer 12 is promoted, and the reliability (resistance) of the Cu conductive layer 12 with respect to defects such as stress migration and electro migration can be enhanced.

Moreover, in the present embodiment, any metal oxide layer by the atmosphere opening does not exist between the Cu conductive layer 12 (seed Cu film 9), and the third barrier metal film (PVD-Ti film) 8 which is an upper-layer barrier metal film directly contacting the Cu conductive layer. Therefore, there is little possibility that Cu aggregates because of the presence of the metal oxide layer. That is, there is little possibility that the reliability of the semiconductor device 13 is deteriorated by the presence of the metal oxide layer. The barrier metal film 11 of the present embodiment has the intermediate barrier metal film 7 formed of the CVD-TiSiN film between the respective barrier metal films (PVD-Ti films) 6, 8 of the upper and lower layers. Accordingly, in general, a barrier performance of the Ti film which is supposed to be inferior to the CVD or ALD film in a diffusion barrier property of Cu can be compensated. That is, in the barrier metal film 11 of the present embodiment, the diffusion barrier property of Cu is enhanced as compared with a case where the barrier metal film is formed of a single-layer film of Ti.

Furthermore, all thermal treatment steps were set in such a manner that the steps were performed at about 400° C. or less in the present embodiment. Accordingly, Ti—Cu alloying can be inhibited in the interface between the Cu conductive layer 12 and the PVD-Ti film 8. Moreover, the resistance values in the Cu wire 12a and the Cu via plug 12b can be inhibited from being raised by Ti diffusion in the Cu conductive layer 12.

Second Embodiment

Next, a second embodiment of the present invention will be described with reference to FIGS. 13A to 15. FIGS. 13A to 15 are process sectional views showing a method of manufacturing a semiconductor device according to the present embodiment. It is to be noted that the same part as that of the above-described first embodiment is denoted with the same reference numerals, and detailed description thereof is omitted.

The present embodiment is different from the first embodiment in that a Cu conductive layer is formed into a so-called single damascene structure in which a Cu wire is separate from a Cu via plug. Other respects are similar to those of the first embodiment. The present embodiment will be briefly described hereinafter.

First, as shown in FIG. 13A, a via hole 22b is formed of a predetermined pattern through a first inter level dielectric (lower-layer inter level dielectric of an n-th layer) 21a of the n-th layer along a thickness direction in such a manner as to expose the surface of a lower-layer Cu wire 3 by a method similar to that of the first embodiment.

Next, as shown in FIG. 13B, a first barrier metal film (PVD-Ti film) 23, a second barrier metal film (CVD-TiSiN film) 24, and a third barrier metal film (PVD-Ti film) 25 are continuously formed in the via hole 22b without being opened to the atmosphere. Subsequently, a seed Cu film (not shown) is continuously provided on the third barrier metal film 25 without being opened to the atmosphere. Subsequently, a Cu plating film (not shown) is plated/grown on the seed Cu film to thereby fill in the via hole 22b. Thereafter, the first to third barrier metal films 23, 24, 25, and the Cu film are subjected to a CMP process. Accordingly, a Cu via plug 27b coated with a barrier metal film 26 constituted of a three-layer structure of the first to third barrier metal films 23, 24, 25 is formed in the lower-layer inter level dielectric 21a of the n-th layer.

Next, as shown in FIG. 14A, a second inter level dielectric (upper-layer inter level dielectric of the n-th layer) 21b of the n-th layer is provided on the lower-layer inter level dielectric 21a of the n-th layer in which the barrier metal film 26 and the Cu via plug 27b are formed. Subsequently, a wiring groove 22a constituted of a predetermined pattern is formed through the upper-layer inter level dielectric 21b along the thickness direction in such a manner as to expose the surfaces of the barrier metal film 26 and the Cu via plug 27b.

Next, as shown in FIG. 14B, a first barrier metal film (PVD-Ti film) 28, a second barrier metal film (CVD-TiSiN film) 29, and a third barrier metal film (PVD-Ti film) 30 are continuously formed and provided in the wiring groove 22a without being opened to the atmosphere. Subsequently, a seed Cu film (not shown) is continuously provided on the third barrier metal film 30 without being opened to the atmosphere. Subsequently, a Cu plating film (not shown) is plated/grown on the seed Cu film to thereby fill in the wiring groove 22a. Thereafter, the first to third barrier metal films 28, 29, 30 and the Cu film are subjected to the CMP process. Accordingly, a Cu wire 27a coated with a barrier metal film 31 constituted of the three-layer structure of the first to third barrier metal films 28, 29, 30 is formed in the upper-layer inter level dielectric 21b of the n-th layer.

By the above-described steps, a Cu conductive layer 27 constituted of the single damascene structure in which the Cu wire 27a is formed separately from the Cu via plug 27b is formed in an inter level dielectric 21 of the n-th layer.

Figure 15:
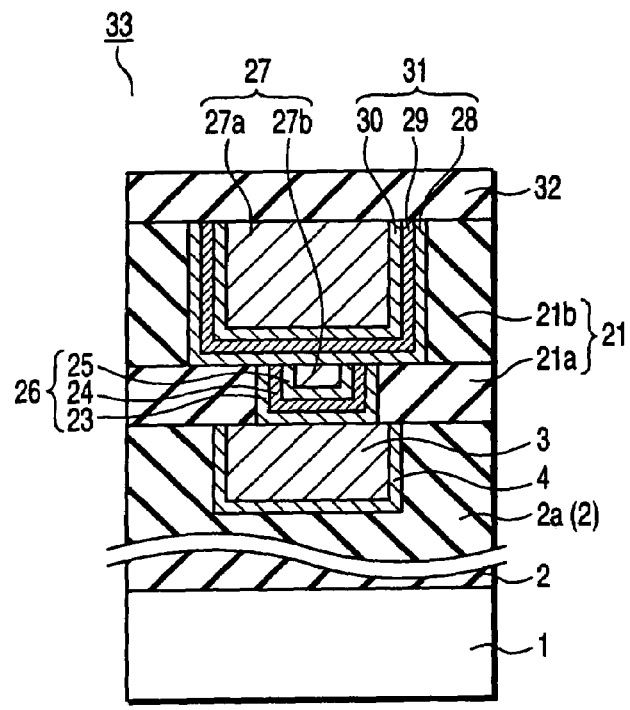
FIG. 15 is a process sectional view showing the method of manufacturing the semiconductor device according to the second embodiment.

Next, as shown in FIG. 15, the barrier metal film 31 and the Cu wire 27a are coated, and an inter level dielectric (upper-layer insulating film) 32 of an n+1-th layer is provided on the surface of the upper-layer inter level dielectric 21b of the n-th layer. A desired semiconductor device 33 having a wiring structure shown in FIG. 15 is hereinafter obtained through predetermined steps. That is, the semiconductor device 33 of the present embodiment is obtained having a two-layer Cu stacked wiring structure constituted of the lower-layer Cu wire 3 and the Cu single damascene wire 27 as a Cu multilayered wiring structure.

As described above, according to the second embodiment, an effect similar to that of the first embodiment can be obtained. Since the barrier metal film 31 constituted of the three-layer structure of the PVD-Ti film 28, CVD-TiSiN film 29, and PVD-Ti film 30 is provided between the Cu wire 27a and the Cu via plug 27b, there is little possibility that the problems described in the background technique occur between the Cu wire 27a and the Cu via plug 27b.

Third Embodiment

Next, a third embodiment of the present invention will be described with reference to FIGS. 16 to 20. FIGS. 16 to 20 are sectional views showing a semiconductor device according to the present embodiment. It is to be noted that the same part as that of the above-described first and second embodiments is denoted with the same reference numerals, and detailed description thereof is omitted.

In the present embodiment, a semiconductor device having a multilayered wiring structure and a semiconductor device having a dummy wiring structure manufactured by applying the method of manufacturing the semiconductor device according to at least one of the first and second embodiments will be described in accordance with several concrete examples.

Figure 16:
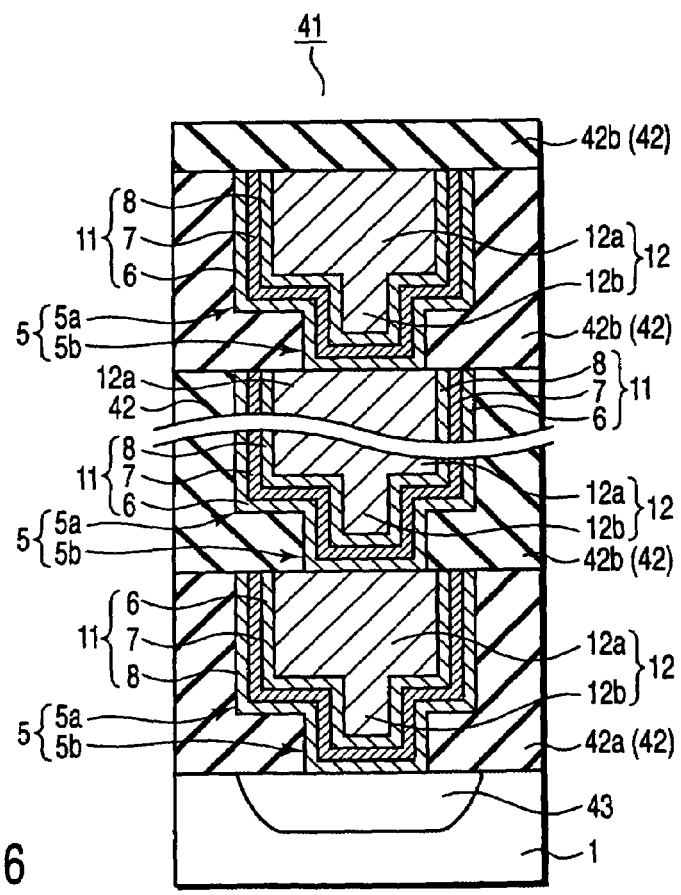
FIG. 16 is a sectional view showing the semiconductor device according to one mode of a third embodiment.

First, a semiconductor device 41 shown in FIG. 16 is manufactured by applying the method of manufacturing the semiconductor device according to the first embodiment. Concretely, first a recess 5 formed in an inter level dielectric 42a (42) of a lowermost layer (first layer) provided on the surface of a semiconductor substrate 1 is filled with a first barrier metal film 6, second barrier metal film 7, third barrier metal film 8, and Cu film 12 by a method similar to that of the first embodiment. Thereafter, the Cu film 12 of the first layer buried in the recess 5 is coated, and an inter level dielectric 42b (42) of a second layer, which is an upper-layer insulating film, is provided on the inter level dielectric 42a of the first layer. Subsequently, the surface of the Cu film 12 of the first layer is exposed in the inter level dielectric 42b of the second layer to form the recess 5 of the second layer. Subsequently, the first barrier metal film 6 is brought into contact with the Cu film 12 of the first layer, and provided in the recess 5 of the second layer by a PVD process. Subsequently, the second barrier metal film 7 is provided on the first barrier metal film 6 by at least one of CVD and ALD processes. Subsequently, the third barrier metal film 8 is provided on the second barrier metal film 7 by the PVD process. These first to third barrier metal films 6, 7, 8 are continuously formed without being opened to the atmosphere. Subsequently, the Cu film 12 of the second layer is provided as an upper-layer Cu film on the third barrier metal film 8 of the second layer without being opened to the atmosphere to thereby fill in the recess 5 in the inter level dielectric 42b of the second layer.

Thereafter, this process is performed once or more. Accordingly, the semiconductor device 41 is obtained having a structure in which a plurality of Cu conductive layers 12 constituted of a dual damascene structure coated with the barrier metal film 11 including the three-layer structure of the first to third barrier metal films 6, 7, 8 and comprising the Cu wire 12a formed integrally with the Cu via plug 12b are stacked and provided. The respective Cu conductive layers 12 are electrically connected to one another via the barrier metal film 11. Moreover, the Cu conductive layer 12 (Cu via plug 12b) of the lowermost layer is electrically connected to a diffusion layer 43 which is a lower conductive layer formed in a surface layer portion of the semiconductor substrate 1 via the barrier metal film 11.

Figure 17:
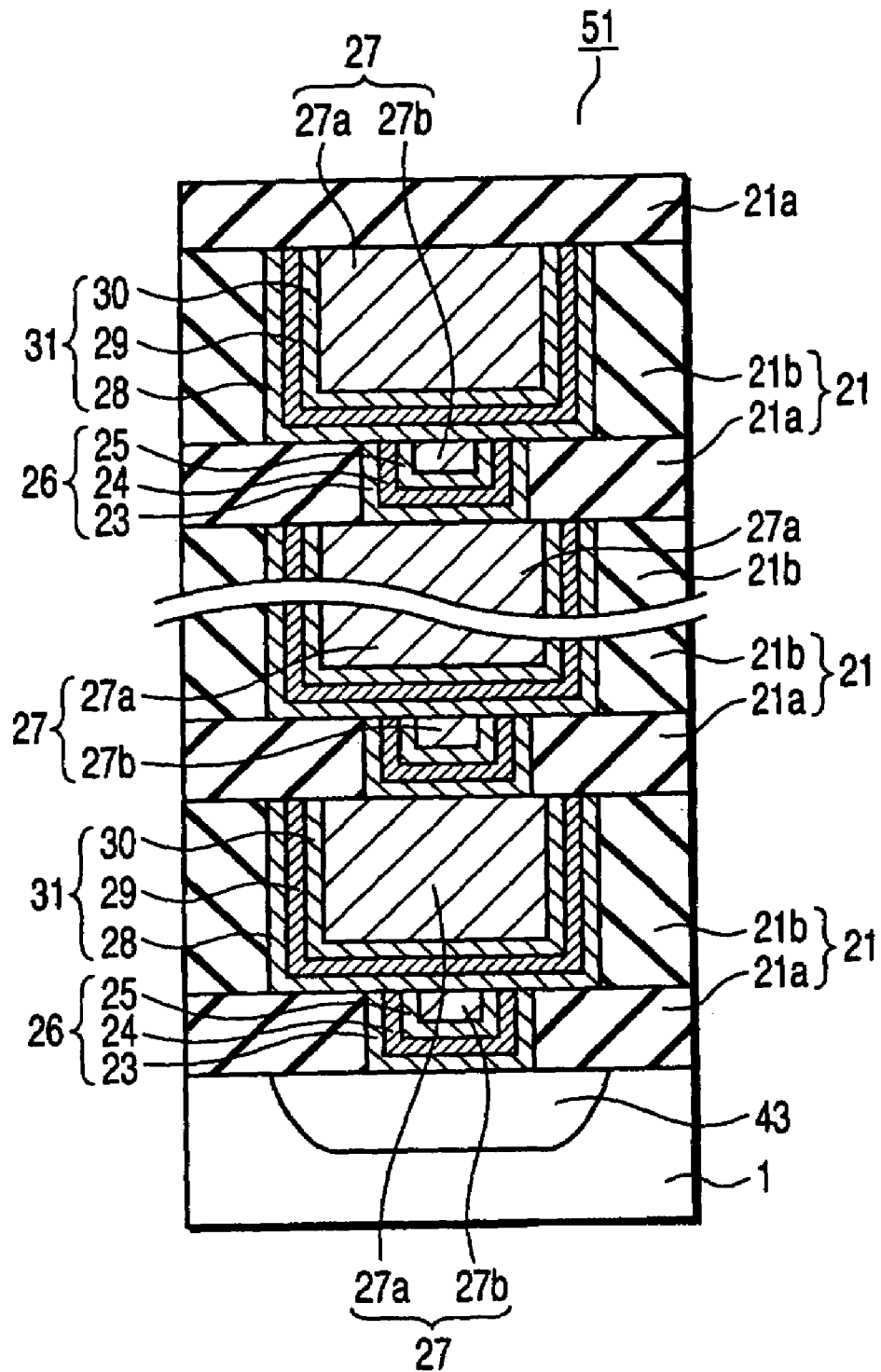
FIG. 17 is a sectional view showing the semiconductor device according to another mode of the third embodiment.

Next, a semiconductor device 51 shown in FIG. 17 is manufactured by applying the method of manufacturing the semiconductor device according to the second embodiment.

That is, the device has a structure in which a plurality of Cu conductive layers 27 are stacked and provided. Each Cu conductive layer 27 is constitute of a single damascene structure in which a Cu via plug 27b coated with a barrier metal film 26 constituted of the three-layer structure of first to third barrier metal films 23, 24, 25 is formed separately from a Cu wire 27a coated with a barrier metal film 31 constituted of the three-layer structure of first to third barrier metal films 28, 29, 30. The respective Cu conductive layers 27 are electrically connected to one another via the barrier metal films 26, 31. Moreover, the Cu conductive layer 27 (Cu contact plug 27b) of the lowermost layer is electrically connected to the diffusion layer 43 formed in the surface layer portion of the semiconductor substrate 1 via the barrier metal films 26, 31.

Figure 18:
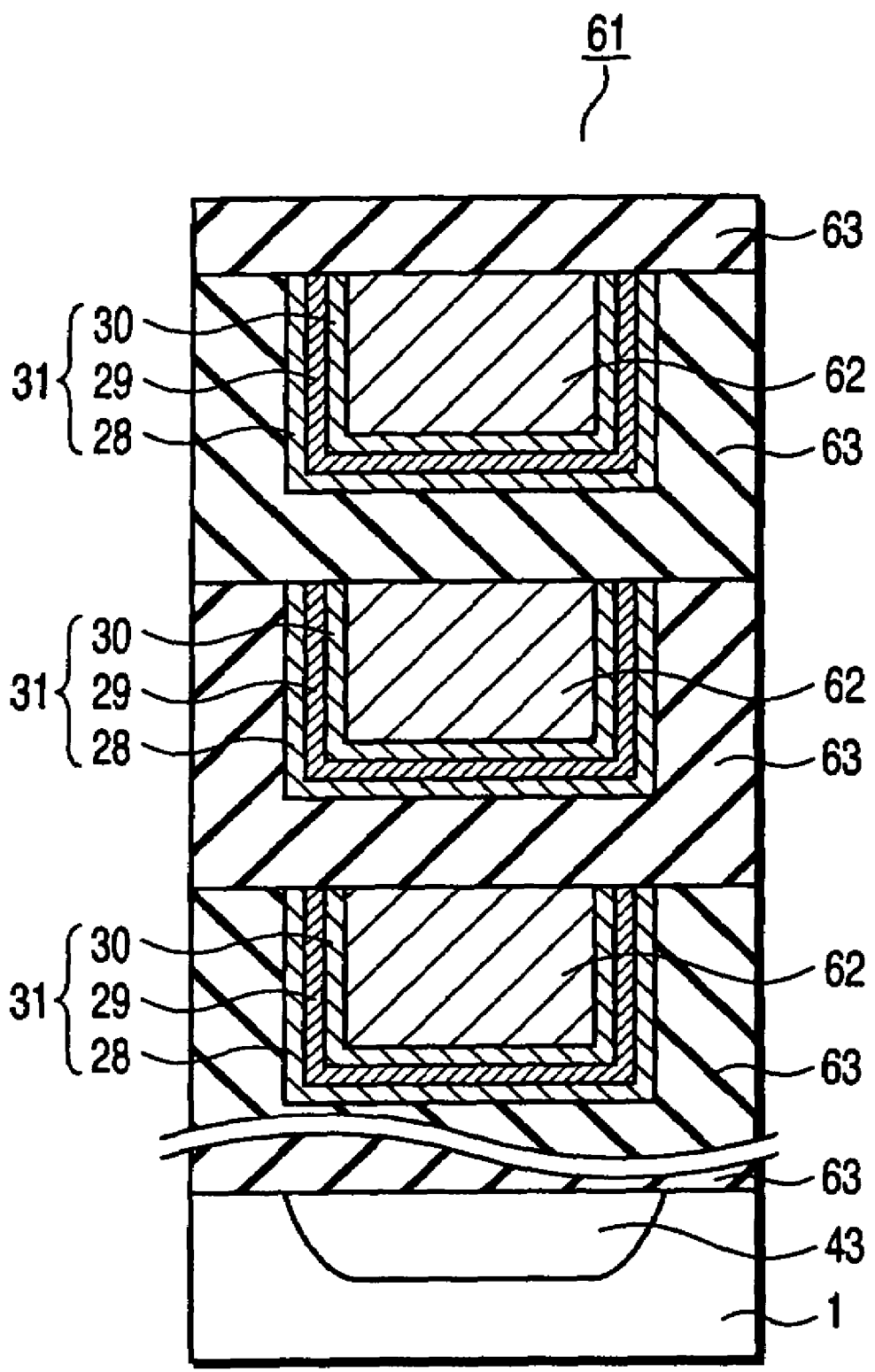
FIG. 18 is a sectional view showing the semiconductor device according to still another mode of the third embodiment.

Next, a semiconductor device 61 shown in FIG. 18 is manufactured by applying the method of manufacturing the semiconductor device according to the first and second embodiments. That is, a Cu conductive layer 62 is formed as a Cu wire only. Moreover, the Cu conductive layers 62 are provided in inter level dielectrics 63 each comprising a single-layer film and stacked into a plurality of layers. Each Cu conductive layer 62 is coated with the barrier metal film 31 constituted of the three-layer structure of the first to third barrier metal films 28, 29, 30.

Figure 19:
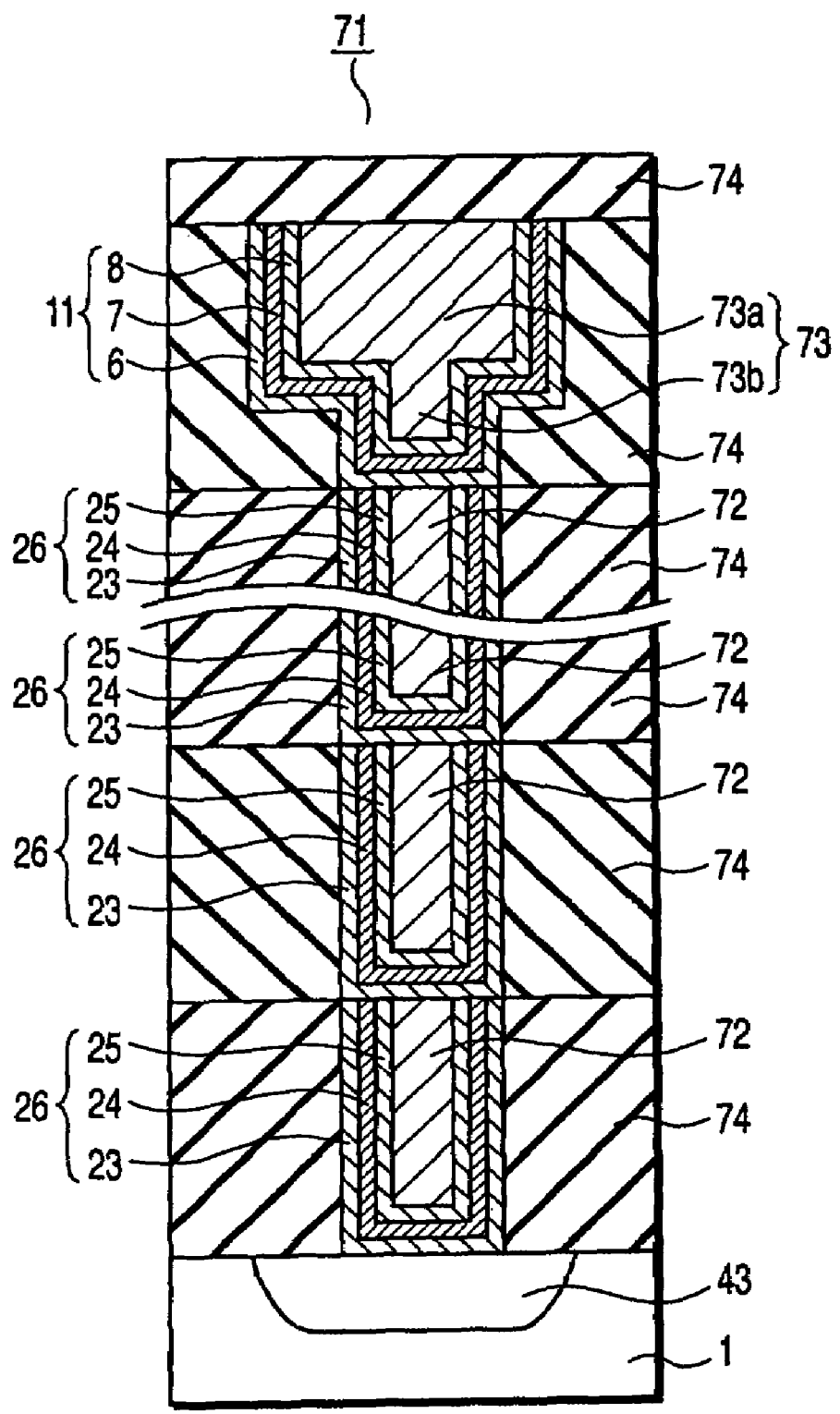
FIG. 19 is a sectional view showing the semiconductor device according to still another mode of the third embodiment.

Next, a semiconductor device 71 shown in FIG. 19 is also manufactured by applying the method of manufacturing the semiconductor device according to the first and second embodiments. That is, a Cu conductive layers 72 excluding an uppermost layer are formed as Cu via plugs only. Moreover, the uppermost Cu conductive layer 73 is formed into a dual damascene structure in which a. Cu wire 73a is integrated with a Cu via plug 73b. The respective Cu via plugs 72 and the Cu conductive layer 73 are provided in inter level dielectrics 74 each constituted of a single-layer film and stacked into a plurality of layers. The Cu via plug 72 of each layer is coated with a barrier metal film 26 constituted of a three-layer structure of first to third barrier metal films 23, 24, 25. The Cu conductive layer 73 of the uppermost layer is coated with a barrier metal film 11 constituted of a three-layer structure of first to third barrier metal films 6, 7, 8. Furthermore, the Cu via plug (Cu contact plug) 72 of the lowermost layer is electrically connected to a diffusion layer 43 formed in a surface layer portion of the semiconductor substrate 1 via the barrier metal film 26.

Figure 20:
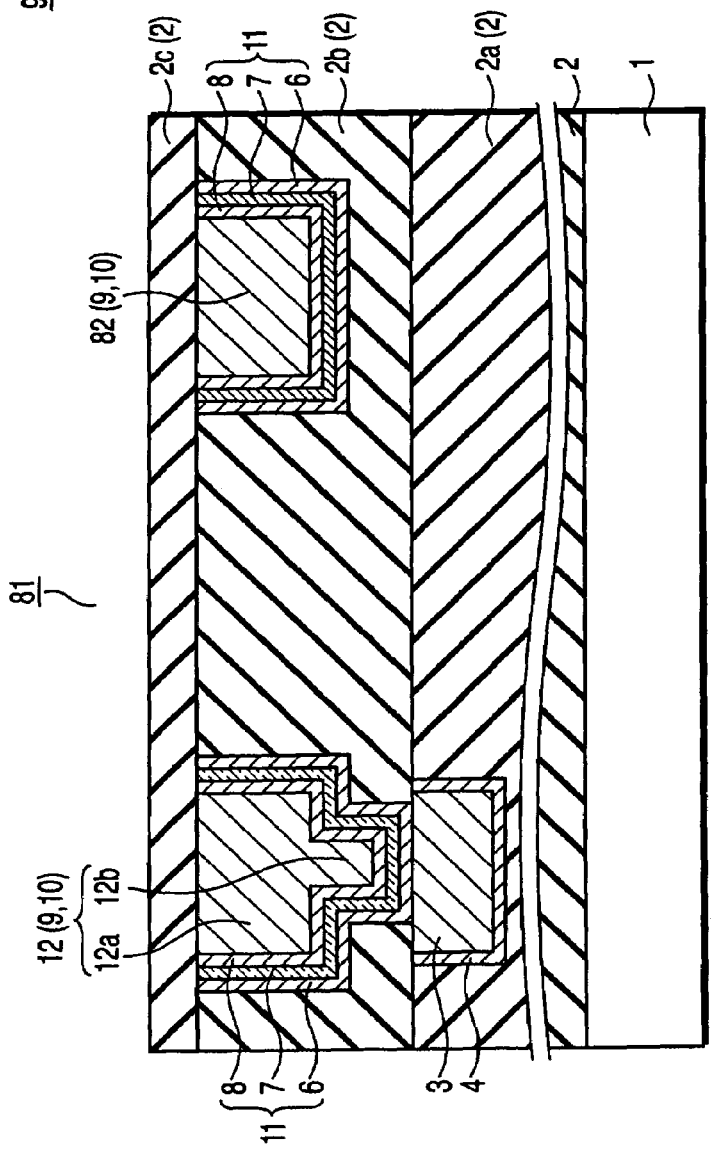
FIG. 20 is a sectional view showing the semiconductor device according to still another mode of the third embodiment.

Moreover, a semiconductor device 81 shown in FIG. 20 is manufactured by applying the method of manufacturing the semiconductor device according to the first embodiment. That is, when manufacturing a semiconductor device 13 according to the first embodiment shown in FIG. 4B, a Cu conductive layer 12 and a barrier metal film 11 of an n-th layer are formed, and simultaneously a Cu dummy conductive layer (Cu dummy film) 82 is provided at a predetermined distance from the Cu conductive layer 12. This Cu dummy conductive layer 82 is formed as the Cu dummy wire 82 constituted of a wire only that does not include any via plug. The Cu dummy conductive layer 82 constituted of this structure can be easily formed substantially by the same step as that of the Cu conductive layer 12. Additionally, the Cu dummy conductive layer 82 is not a conductive layer provided as an effective wire through which current is actually passed, unlike the Cu conductive layer 12. The Cu dummy conductive layer 82 is provided in order to reduce stress (external force) applied to the Cu conductive layer 12 by a CMP process, thermal contraction and expansion of an inter level dielectric 2 or the like.

As described above, the Cu conductive layer 12 is coated with the barrier metal film 11 constituted of the three-layer structure of the first to third barrier metal films 6, 7, 8. Therefore, adhesion of the Cu conductive layer 12 to the barrier metal film 11 is high. Therefore, the Cu conductive layer 12 itself has a high resistance to the stress applied to the Cu conductive layer 12. Since the Cu dummy conductive layer 82 coated with the barrier metal film 11 in the same manner as in the Cu conductive layer 12 is provided around the Cu conductive layer 12, the resistance of the Cu conductive layer 12 with respect to the stress can be largely enhanced.

As described above, according to the third embodiment, effects similar to those of the first and second embodiments can be obtained. The semiconductor devices having various structures and performances can be provided in accordance with specifications of the semiconductor devices.

Fourth Embodiment

Figure 21:
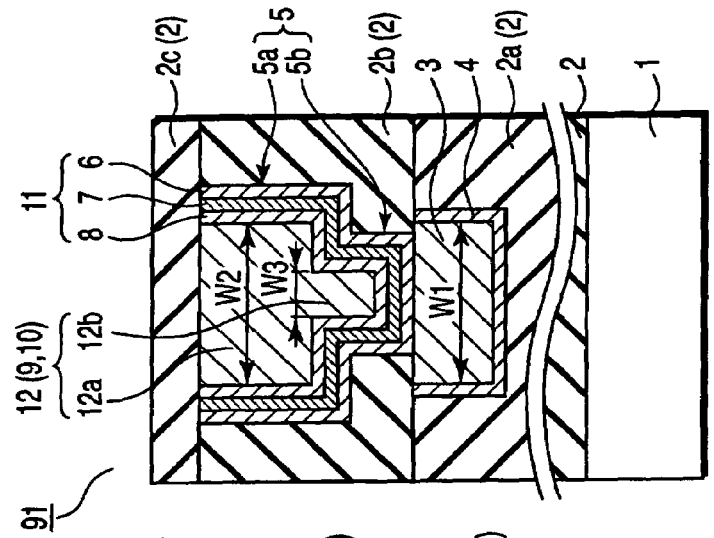
FIG. 21 is a sectional view showing the semiconductor device according to a fourth embodiment.
Figure 23A:
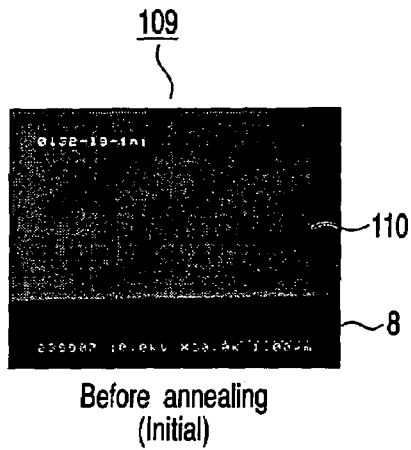
FIGS. 23A to 23C are photographs showing the dependence, on the temperature, of the surface state of the Cu seed layer provided by the method of manufacturing the semiconductor device according to one mode of the background technique which is a comparative example with respect to the fourth embodiment.
Figure 23B:
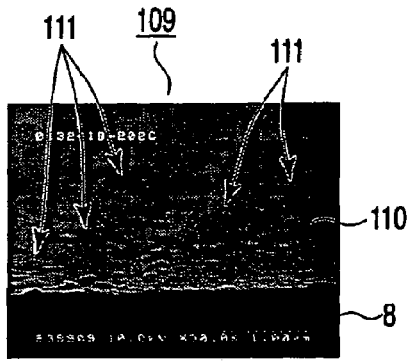
Figure 23C:
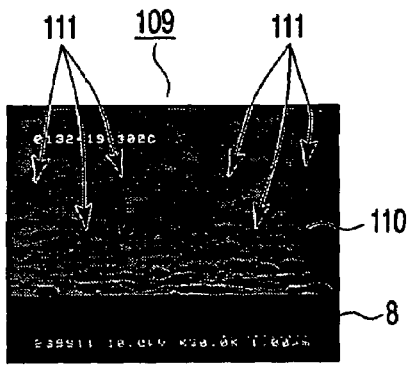
Figure 26:
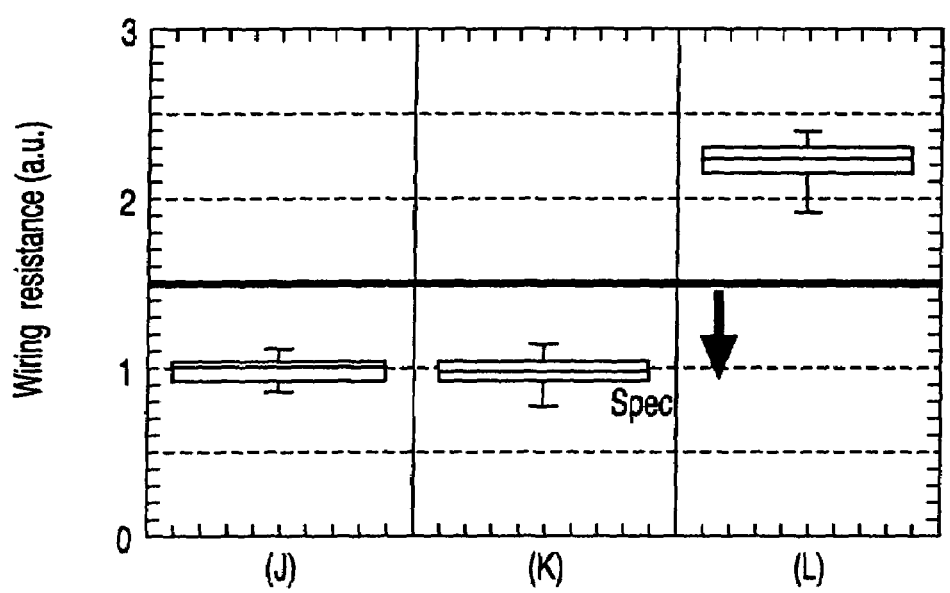
FIG. 26 is a graph showing resistance values of the Cu wire according to the fourth embodiment and that according to the background technique after the sinter test.

Next, a fourth embodiment of the present invention will be described with reference to FIGS. 21 to 26. FIG. 21 is a sectional view showing a semiconductor device according to the present embodiment. FIGS. 22A to 22C are photographs showing dependence of a surface state of a Cu seed layer provided by a method of manufacturing the semiconductor device according to the present embodiment on temperature. FIGS. 23A to 23C are photographs showing the dependence, on the temperature, of the surface state of the Cu seed layer provided by the method of manufacturing the semiconductor device according to one mode of a background technique which is a comparative example with respect to the present embodiment. FIG. 24 is a graph showing the dependences, on wiring widths, of SIV resistances of a combination of a Cu wire and a lower-layer Cu wire according to the present embodiment using a PVD-Ti film as a barrier metal film, and a combination of the Cu wire and the lower-layer Cu wire according to the background technique. FIG. 25 is a graph showing Ti concentration in the Cu wire according to the present embodiment, and depth of diffusion of Ti for each of different sinter annealing temperatures. FIG. 26 is a graph showing resistance values of the Cu wire according to the present embodiment and that according to the background technique after a sinter test. It is to be noted that the same part as that of the first to third embodiments is denoted with the same reference numerals, and detailed description thereof is omitted.

In the present embodiment, at least a third barrier metal film 8 in first and third barrier metal films 6, 8 used in the first to third embodiments is formed substantially as a single-layer film constitute of Ti. Moreover, first to third barrier metal films 6, 7, 8 buried in a recess 5 for a conductive layer, and a Cu wire 12 constituted of first and second Cu films 9, 10 are annealed at about 420° C. or less. Accordingly, concentration of Ti diffused in the Cu wire 12 from the third barrier metal film 8 by the annealing is suppressed to be less than about 1.2 atomic %. Accordingly, electric reliabilities of the Cu wire such as resistances to stress induced voiding and electro migration are enhanced without raising a resistance value of the Cu wire.

First, the semiconductor device and the manufacturing method according to the present embodiment will be described with reference to FIG. 21. The method of manufacturing the semiconductor device of the present embodiment is substantially similar to the method of manufacturing the semiconductor device according to the first embodiment except the temperature of the annealing with respect to the first to third barrier metal films 6, 7, 8 buried in the recess 5 for the conductive layer, and the Cu wire 12 constituted of the first and second Cu films 9, 10.

First, as shown in FIG. 21, a wiring groove 5a and a via hole 5b constituted of predetermined patterns are integrally formed through an inter level dielectric 2b of an n-th layer along the thickness direction in such a manner as to expose the surface of a lower-layer Cu wire 3 by a method similar to that of the first embodiment.

Next, the surface of the inter level dielectric 2b of the n-th layer, and the exposed surface of the lower-layer Cu wire 3 are coated, and a first barrier metal film (lower barrier metal layer) 6 constituted of a single-layer film of Ti is provided in the recess 5 for the conductive layer. This Ti film 6 is formed into a film thickness of about 3 nm by a PVD process (sputtering process) without being opened (exposed) to the atmosphere. Subsequently, a second barrier metal film (intermediate barrier metal layer) 7 constituted of TiSiN which is a metal nitride compound is provided on the surface of the first barrier metal film (Ti film) 6. This TiSiN film 7 is formed into a film thickness of about 3 nm continuously to the Ti film 6 by a CVD process without being opened to the atmosphere. Subsequently, a third barrier metal film (upper barrier metal layer) 8 constituted of a single-layer film of Ti is provided on the surface of the second barrier metal film (TiSiN film) 7. In the present embodiment, the Ti film 8 is formed into a film thickness of about 15 nm continuously to the TiSiN film 7 by the PVD process (sputtering process) without being opened to the atmosphere.

Next, a first Cu film (seed-Cu film) 9 constituting a seed layer (underlayer) for providing a second Cu film 10 is provided on the surface of the third barrier metal film (Ti film) 8 by the PVD process (sputtering process). In the present embodiment, the first Cu film 9 is formed into a film thickness of about 60 nm continuously to the Ti film 8 without being opened to the atmosphere. Subsequently, the second Cu film 10 constituting a Cu wire main body which is a main portion of the Cu wire is formed on the surface of the first Cu film (seed Cu film) 9 by the plating process, whereas the first Cu film constituting the underlayer of the second Cu film is formed as a seed layer. The Cu plating film 10 which is the second Cu film is integrated, plated, and grown on the seed Cu film 9 until a film thickness of the Cu plating film together with the seed Cu film 9 reaches about 800 nm in the same manner as in the first embodiment. Accordingly, the conductive layer recess 5 constituted of the wiring groove 5a and the via hole 5b is filled with the three-layered structure barrier metal film 11, the seed Cu film 9, and the Cu plating film 10. After finishing the filling-in of the conductive layer recess 5, heating temperature is set at about 150° C., heating time is set to about 60 minutes, and the inter level dielectric 2b and the respective films 6, 7, 8, 9, 10 and the like are annealed.

Next, the unnecessary first to third barrier metal films 6, 7, 8, seed Cu film 9, and Cu plating film 10 outside the conductive layer recess 5 are polished and removed by a CMP process. Accordingly, the Cu dual damascene wire 12 in which the Cu wire 12a is formed integrally with the Cu via plug 12b is coated with the barrier metal film 11 constituted of the three-layer structure of the first to third barrier metal films 6, 7, 8, and provided in the recess 5 for the conductive layer.

Next, the barrier metal film 11 and the Cu dual damascene wire 12 are coated, and an inter level dielectric (upper-layer insulating film) 2c of an n+1-th layer is provided on the surface of the inter level dielectric 2b of the n-th layer by the CVD process. Subsequently, heating temperature is set to about 370° C., heating time is set to about 60 minutes, and the inter level dielectrics 2b, 2c, barrier metal film 11, Cu dual damascene wire 12 and the like are sintered/annealed. Thereafter, a desired semiconductor device 91 having a wiring structure shown in FIG. 21 is obtained through predetermined steps. That is, the semiconductor device 91 of the present embodiment having a Cu stacked wiring structure of two layers constituted of the lower-layer Cu wire 3 and the Cu dual damascene wire 12 as a Cu multilayered wiring structure is obtained.

Next, several experiments performed by the present inventors in order to check reliability, quality, electric characteristic and the like of the semiconductor device 91 manufactured by the method of manufacturing the semiconductor device according to the present embodiment described above, and the results will be described with reference to FIGS. 22A to 26.

First, an experiment in which aggregation of Cu in the seed Cu film was checked, and results will be described with reference to FIGS. 22A to 22C and FIGS. 23A to 23C. This experiment was performed in order to check adhesion of the barrier metal film to the seed Cu film (seed Cu layer) provided on the surface of the barrier metal film. Concretely, aggregation state of Cu in the seed Cu film on the barrier metal film in a case where the barrier metal film was opened to the atmosphere was compared with that in a case where the film was not opened to the atmosphere before forming the seed Cu film. The present inventors prepared two, twelfth and thirteenth samples 15, 109 as described below in performing this Cu aggregation test.

First, the twelfth sample 15 shown in FIGS. 22A to 22C was formed up to the seed Cu film 9 in the same manner as in the above-described method of manufacturing the semiconductor device according to the present embodiment. Concretely, first a solid PVD-Ti film corresponding to a third barrier metal film (Ti barrier metal film) 8 was provided on a solid SiO$_2$ film corresponding to an inter level dielectric 2 until a film thickness reached about 10 nm in vacuum. Subsequently, a solid PVD-seed Cu film (PVD-seed-Cu film) 9 was continuously provided on the PVD-Ti film 8 until the film thickness reached about 10 nm in vacuum. Thus, the twelfth sample 15 has a structure in which the respective solid films including the PVD-Ti film 8 and the PVD-seed-cu film 9 continuously formed without being exposed (opened) to the atmosphere are stacked and provided on the solid SiO$_2$ film. This structure will be referred to as SiO$_2$ film/PVD-Ti film 8/PVD-seed-Cu film 9.

It is to be noted that "/" indicates that there is not any atmosphere exposure in forming previous/subsequent films in the same manner as in the first embodiment. In the photographs shown in FIGS. 22A to 22C, the only PVD-Ti film 8 and PVb-seed-Cu film 9 in the above-described structure are shown, and the SiO$_2$ film is not shown. This twelfth sample 15 represents a first example according to the present embodiment.

Next, with regard to the thirteenth sample 109 shown in FIGS. 23A to 23C, unlike the method of manufacturing the semiconductor device according to the present embodiment, after forming the solid PVD-Ti film 8, the solid PVD-Ti film 8 was opened to the atmosphere before forming the solid PVD-seed-Cu film 9 on the PVD-Ti film. Concretely, first, a solid PVD-Ti film 8 corresponding to the third barrier metal film (Ti barrier metal film) was provided on the solid SiO$_2$ film until the film thickness reached about 10 nm in vacuum. Subsequently, the solid PVD-Ti film 8 was exposed (opened) to the atmosphere to thereby form an oxide layer in a surface layer portion before forming a PVD-seed-Cu film 110 on the solid PVD-Ti film 8. Thereafter, a solid PVD-seed-Cu film 110 was provided on the solid PVD-Ti film 8 on which the oxide layer was formed in the surface layer portion until the film thickness of the PVD-seed-Cu film reached about 10 nm in vacuum. That is, the thirteenth sample 109 has substantially the same structure as that of the twelfth sample 15 except that the solid PVD-seed-Cu film 110 is formed on the solid PVD-Ti film 8 exposed to the atmosphere. This structure will be referred to as $SiO_2$ film/PVD-Ti film 8//PVD-seed-Cu film 110.

It is to be noted that "//" indicates that there is atmosphere exposure in forming previous/subsequent films in the same manner as in the first embodiment. In the photographs shown in FIGS. 23A to 23C, the only PVD-Ti film 8 and PVD-seed-Cu film 110 in the above-described structure are shown, and the $SiO_2$ film is not shown. This thirteenth sample 109 is a first comparative example with respect to the twelfth sample 15 which is the first example according to the present embodiment.

In this test, first the twelfth and thirteenth samples 15, 109 were annealed at about 370° C. and 450° C. for about one hour. Thereafter, the surfaces of the respective PVD-seed-Cu films 9, 110 of the annealed samples 15, 109 were observed by SEM. Moreover, the surfaces of the PVD-seed-Cu films 9, 110 of the samples 15, 109 which were not annealed were observed by the SEM. FIGS. 22A to 22C, and FIGS. 23A to 23C show results of the observation of the surfaces of the samples 15, 109 by the SEM before the annealing, after the annealing at about 370° C., and after the annealing at about 450° C.

As shown in FIGS. 22A to 22C, in the twelfth sample 15 prepared by the method of manufacturing the semiconductor device according to the present embodiment, the aggregation of Cu on the PVD-seed-Cu film 9 was hardly observed in any state before the annealing, or after the annealing at about 370° C. and 450° C.

Moreover, as shown in FIG. 23A, in the thirteenth sample 109 in which the PVb-Ti film 8 was exposed to the atmosphere, and thereafter the PVD-seed-Cu film 110 was formed, the aggregation of Cu on the PVD-seed-Cu film 110 was hardly observed before the annealing. However, as shown in FIG. 23B, aggregation 111 of Cu was partially observed on the PVD-seed-Cu film 110 after the annealing at about 370° C. Furthermore, as shown in FIG. 23C, after the annealing at about 450° C., the aggregations 111 of Cu were substantially entirely scattered and observed on the PVD-seed-Cu film 110.

By the result of the aggregation test of Cu, the following has been found. When the PVD-Ti film 8 and the PVD-seed-Cu film 9 are continuously formed without being exposed to the atmosphere, as shown in FIG. 22C, Cu does not aggregate even by the annealing of the PVD-seed-Cu film 9 at about 450° C. On the other hand, it has been found that when the PVD-seed-Cu film 110 is formed on the PVD-Ti film 8 exposed to the atmosphere, adhesion of the PVD-Ti film 8 to the PVD-seed-Cu film 110 is obstructed by the oxide layer existing in the interface (surface layer portion of the PVD-Ti film 8) between the PVD-Ti film 8 and the PVD-seed-Cu film 110, and the adhesion between the respective films 8, 110 deteriorates (drops). It is additionally expected that the reliability of the semiconductor device having the wire formed by forming the Cu film on the Ti film including the oxide layer formed in the surface layer portion is deteriorated. In the twelfth sample 15 prepared by the method of manufacturing the semiconductor device according to the present embodiment, even if the annealing temperature is raised at about 450° C., Cu does not aggregate. The annealing is possible even at high temperature of about 450° C. That is, the twelfth sample 15 has resistance (reliability) capable of holding a film quality of the PVD-seed-Cu film in an appropriate state even at high temperature of about 450° C.

Moreover, in the same manner as in the aggregation experiment of Cu described in the first embodiment, this experiment is absolutely an acceleration experiment in which each of the PVD-seed-Cu films 9, 110 is formed into a thin film in a Cu easily aggregated state (accelerated state). That is, the experiment is performed for a purpose of easily comparing aggregated states of Cu in the respective PVD-seed-Cu films 9, 110 provided on various barrier metal films formed by various materials or film forming processes. Additionally, according to an additional test performed by the present inventors, it has been found that a result similar to that of the twelfth sample 15 can be obtained even in the barrier metal films 11, 26, 31 of the three-layer structure according to the present embodiment and the first to third embodiments.

Secondly, an experiment in which resistance (reliability) of the Cu conductive layer with respect to stress induced voiding (SIV) was checked, and results will be described with reference to FIG. 24. To perform this SIV test, the present inventors roughly prepared the following two, fourteenth and fifteenth samples.

First, although not shown, the fourteenth sample was prepared by the method of manufacturing the semiconductor device according to the background technique. That is, in the fourteenth sample, the barrier metal film constituted of a PVD-Ta film was formed into a film thickness of about 10 nm without being opened to the atmosphere. The diameter of the Cu via plug 12b shown by a solid-line arrow W3 in FIG. 21 was set to about 0.14 μm. Additionally, the width of the lower-layer Cu wire 3 shown by a solid-line arrow W1 in FIG. 21, and the width of the Cu wire 12a shown by a solid-line arrow W2 in FIG. 21 were set to six different sizes of about 0.42 μm, 1 μm, 2 μm, 5 μm, 10 μm, and 25 μm, and combined. Concretely, as shown in FIG. 24, the combination of the width W1 of the lower-layer Cu wire 3 with the width W2 of the Cu wire 12a was changed to thereby prepare seven types of fourteenth samples (29) to (35). These seven types of fourteenth samples are second comparative examples with respect to the fifteenth sample which is a second example according to the present embodiment as described later.

Next, in the fifteenth sample, the barrier metal film was prepared as a three-layer structure barrier metal film constituted of PVD-Ti film (first barrier metal film)/CVD-TiSiN film (second barrier metal film)/PVD-Ti film (third barrier metal film) by the method of manufacturing the semiconductor device according to the present embodiment. Moreover, in the fifteenth sample, the PVD-Ti film which was a third barrier metal film (upper-layer barrier metal film) was formed into a film thickness of about 10 nm without being opened to the atmosphere. In the same manner as in the fourteenth sample, a diameter W3 of the Cu via plug 12b was set to about 0.14 μm in this fifteenth sample. Moreover, the width W1 of the lower-layer Cu wire 3, and the width W2 of the Cu wire 12a were set to six different sizes of about 0.42 μm, 1 μm, 2 μm, 5 μm, 10 μm, and 25 μm, and combined. Concretely, as shown in FIG. 24, the combination of the width W1 of the lower-layer Cu wire 3 with the width W2 of the Cu wire 12a was changed to thereby prepare seven types of fifteenth samples (36) to (42). These seven types of fifteenth samples are second examples according to the present embodiment.

In this SIV test, the diameter W3 of the via plug of each of the above-described fourteenth and fifteenth samples was fixed at about 0.14 μm, the width W1 of the lower-layer Cu wire 3 and the width W2 of the Cu wire 12a were changed, and tendency of defect occurrence ratio by stress was checked. In this case, first each of the fourteenth and fifteenth samples was held at a temperature of about 225° C. in a constant temperature bath (not shown) for about 1000 hours.

Thereafter, an evaluation pattern obtained by combining the lower-layer Cu wire 3 and the Cu wire 12a having the wiring widths W1, W2 set in a range of about 0.42 μm to 25 μm was measured. Here, an SIV test performed with respect to seven types of fourteenth samples (29) to (35) is assumed as (H). An SIV test performed with respect to seven types of fifteenth samples (36) to (42) is assumed as (I). Test results of these SIV tests (H) and (I) are shown in FIG. 24.

As apparent from the graph shown in FIG. 24, in the SIV test (H), the defect occurrence ratio increased in the sample (33) in which both the width W1 of the lower-layer Cu wire 3 and the width W2 of the Cu wire 12a were 25 μm. On the other hand, it has been found that in the SIV test (I), the defect occurrence ratio is remarkably small even in the sample (40) in which both the width W1 of the lower-layer Cu wire 3 and the width W2 of the Cu wire 12a are 25 μm. Further in the SIV test (H), the defect occurrence ratio was almost 0 in the sample (34) among the samples (29) to (35). On the other hand, in the SIV test (I), the defect occurrence ratio was almost 0 in three samples (36), (41), (42) among the samples (36) to (42). By this result, it has been found that the defect occurrence ratio by the resistance rise can be largely reduced regardless of the width W1 of the lower-layer Cu wire 3 or the width W2 of the Cu wire 12a according to the present embodiment as compared with the conventional technique. That is, according to the present embodiment, the SIV reliability (SIV resistance) can be equally or more enhanced as compared with the semiconductor device according to the conventional technique.

Thirdly, an experiment in which an influence of Ti concentration in the Cu wire on wiring resistance was checked, and results will be described with reference to FIGS. 25 and 26. Although not shown, to perform this experiment, the present inventors prepared the following three, sixteenth to eighteenth samples (J), (K), (L). The three, sixteenth to eighteenth samples (J), (K), (L) were all prepared by the method of manufacturing the semiconductor device according to the present embodiment. Concretely, these three, sixteenth to eighteenth samples (J), (K), (L) were evaluation patterns in which the width W2 of the Cu wire 12a was set to about 0.2 μm in the semiconductor device 91 of the present embodiment.

First, the sixteenth sample (J) was annealed at temperature of about 370° C. for about 60 minutes in a sinter annealing step included in the method of manufacturing the semiconductor device according to the present embodiment. Accordingly, as shown by a broken-line graph in FIG. 25, in the sixteenth sample (J), the Ti concentration in the surface layer portion of the Cu wire 12a was set to about 0.07 atomic %. The seventeenth sample (K) was annealed at about 420° C. for about 60 minutes in the sinter annealing step included in the method of manufacturing the semiconductor device according to the present embodiment. Accordingly, as shown by a bold-solid-line graph in FIG. 25, in the seventeenth sample (K), the Ti concentration in the surface layer portion of the Cu wire 12a was set to about 0.9 atomic %. Moreover, the eighteenth sample (L) was annealed at temperature of about 450° C. for about 60 minutes in the sinter annealing step included in the method of manufacturing the semiconductor device according to the present embodiment. Accordingly, as shown by a thin-solid-line graph in FIG. 25, in the eighteenth sample (L), the Ti concentration in the surface layer portion of the Cu wire 12a was set to about 1.2 atomic %. It is to be noted that in the graph of FIG. 25, a depth (a.u.) of the abscissa indicates a depth measured toward the semiconductor substrate 1 from the surface of the Cu wire 12a, which is assumed as 0 in the three sixteenth to eighteenth samples (J), (K), (L) of the semiconductor device 91 of the present embodiment.

The present inventors checked wiring resistances (a.u.) with respect to the three sixteenth to eighteenth samples (J), (K), (L). Results are shown in FIG. 26.

As apparent from the graph shown in FIG. 26, the wiring resistance of the seventeenth sample (K) whose Ti concentration in the Cu wire 12a was about 0.9 atomic % hardly changed as compared with the wiring resistance of the sixteenth sample (J) whose Ti concentration in the Cu wire 12a was about 0.07 atomic %. Concretely, both the wiring resistances of the sixteenth and seventeenth samples (J), (K) were about 0.1 (a.u.), and in an appropriate range. On the other hand, as apparent from the graph shown in FIG. 26, the wiring resistance of the eighteenth sample (L) whose Ti concentration in the Cu wire 12a was about 1.2 atomic % was about twice or more that of each of the sixteenth and seventeenth samples (J), (K). Concretely, the wiring resistance of the eighteenth sample (L) was about 2.25 (a.u.), and completely outside standards.

Thus, it has been found that the rise of the resistance value of the Cu wire 12a can be suppressed, and set in an appropriate range, when the Ti concentration in the Cu wire 12a is set to be less than about 1.2 atomic %. Moreover, it has been found that the annealing temperature with respect to the Cu wire 12a and the Ti barrier metal film 8 may be set at about 420° C. or less in order to set the Ti concentration in the Cu wire 12a to be less than about 1.2 atomic %. Furthermore, although not shown, according to an additional test performed by the present inventors, it has been found that the electric reliability of the Cu wire 12a can be enhanced, when the Ti concentration in the Cu wire 12a is set to at least about 0.05 atomic % or more. It is to be noted that in the present experiment, the Ti concentration in the Cu wire 12a was measured by an SIMS measurement process. According to the SIMS measurement process, a range in which a secondary ion strength ratio (Ti/Cu) of Ti to Cu is about 0.5E-2 or more and less than about 0.7E-1 corresponds to a range in which the Ti concentration in the Cu wire 12a is about 0.05 atomic % or more and less than about 1.2 atomic %.

Moreover, in the semiconductor device 91 of the present embodiment constituted of the structure shown in FIG. 21, the Ti barrier metal film 6 which is the first barrier metal film (lower-layer barrier metal film) also contacts the surface of the lower-layer Cu wire 3. Therefore, there is a possibility that Ti atoms diffuse also to the surface layer portion of the lower-layer Cu wire 3 from the Ti barrier metal film 6 in the sinter annealing step for finishing the Cu wire 12a. However, a contact area of the Ti barrier metal film 6 with the lower-layer Cu wire 3 is sufficiently smaller than that of the Ti barrier metal film 8 which is the third barrier metal film (upper-layer barrier metal film) with the Cu wire 12a. Therefore, the rise of the resistance value of the lower-layer Cu wire 3 by Ti atoms diffused in the lower-layer Cu wire 3 from the Ti barrier metal film 6 can be substantially ignored.

As described above, according to the fourth embodiment, effects similar to those of the first to third embodiments can be obtained.

It is to be noted that the method of manufacturing the semiconductor device according to the present invention is not limited to the first to fourth embodiments. Some of constitutions and manufacturing steps may be variously set without departing from the scope of the present invention, or various settings may be appropriately combined, used, and performed.

For example, the film thicknesses of the Ti films for use as the first and third barrier metal films are not limited to the sizes described in the first and second embodiments. When the Ti film has a film thickness of at least about 1 nm or less, constitutions similar to those of the first to fourth embodiments can be obtained. Moreover, the first and third barrier metal films are not limited to the Ti films. The first and third barrier metal films may be formed by films containing at least one metal element belonging to any one of the groups 4-A, 5-A, and 6-A. Ti, Zr, and Hf belong to the group 4-A, V, Nb, and Ta belong to the group 5-A. Furthermore, Cr, Mo, and W belong to the group 6-A. Therefore, the first and third barrier metal films may be formed by films containing at least one metal element of Ti, Zr, Hf, V, Nb, Ta, Cr, Mo, and W. Even when the films containing these metal elements are used as the first and third barrier metal films, constitutions similar to those of the first to third embodiments can be obtained.

Moreover, the second barrier metal film is not limited to the TiSiN or TaN film used in the first embodiment. The second barrier metal film may be formed by the films containing at least one metal element belonging to any one of the groups 4-A, 5-A, and 6-A. That is, the second barrier metal film may be formed by the film containing at least one metal element of Ti, Zr, Hf, V, Nb, Ta, Cr, Mo, and W. Concretely, as the second barrier metal film, a single-layer film formed of one of TiN, TiC, TiO, TiSiN, Ta, TaN, TaC, TaSiN, WN, WNC, WSiN, VN, and NbN, or a stacked film obtained by combining two or more single-layer films is preferably used. Even when these films are used as the second barrier metal films, constitutions similar to those of the first to fourth embodiments can be obtained. Moreover, as a method of forming the second barrier metal film, at least one of CVD and ALD processes may be used. It is to be noted that all the films do not have to be provided by the same film forming method in a case where a plurality of metal films are stacked as the second barrier metal films. For example, the respective films may be alternately provided and stacked by the CVD and ALD processes.

Moreover, the Cu conductive layers (first and second Cu films) do not have to be necessarily provided in all the inter level dielectrics on the semiconductor substrate. The same number of Cu conductive layers do not have to be provided in all the inter level dielectrics. The number of the Cu conductive layers may differ with each inter level dielectric. The Cu conductive layers do not have to be formed in the same shape in all the interlayer insulating films. The shape of the Cu conductive layer may differ with each inter level dielectric. When a plurality of Cu conductive layers are provided in one inter level dielectric, the shape of each Cu conductive layer may differ within the same inter level dielectric. That is, the Cu conductive layer coated with the barrier metal film comprising the three-layer structure may be selectively formed into a structure of a wire only, a structure of a via plug (contact plug) only, or a structure constituted of a wire and a via plug (contact plug) in accordance with desired specifications of the semiconductor device. Moreover, a predetermined number of Cu conductive layers may be provided in a mixed manner in a predetermined inter level dielectric on the substrate. Alternatively, each Cu conductive layer may be separately prepared and provided for each inter level dielectric.

Furthermore, when a plurality of Cu conductive layers are provided, all the Cu conductive layers do not have to be necessarily electrically connected in a stacking direction. Predetermined Cu conductive layers may be electrically connected to each other among the respective Cu conductive layers in accordance with the desired specifications of the semiconductor device.

Additionally, the Cu conductive layer does not have to be necessarily provided above the conductive layer formed by the method of manufacturing the semi-conductor device according to the background technique as in the first to fourth embodiments. For example, the Cu conductive layer may be provided between the diffusion layer formed in the surface layer portion of the substrate, and the conductive layer provided in a predetermined layer on the substrate according to the background technique. In this case, the Cu conductive layer does not have to be electrically connected to both the diffusion layer, and the conductive layer according to the background technique. The Cu conductive layer may be electrically connected to one of the diffusion layer, and the conductive layer according to the background technique, or may not be electrically connected to either the diffusion layer or the conductive layer according to the background technique. Needless to say, the Cu conductive layers may be provided both above and below the conductive layer provided in the predetermined layer on the substrate according to the background technique. Furthermore, the conductive layer electrically connected to the Cu conductive layer according to the background technique does not have to be formed of Cu. The conductive layer electrically connected to the Cu conductive layer according to the background technique does not have to be formed, for example, of Al.

Moreover, the Cu conductive layer does not have to be necessarily provided as an effective wire which actually functions as the wire as in the first and second embodiments. In the third embodiment, as described with reference to FIG. 20, the adhesion and the resistance to the stress are enhanced in the Cu film. Therefore, the Cu conductive layer may be selectively prepared in the effective wire and the Cu dummy conductive layer (Cu dummy wire). For example, each inter level dielectric 2 was formed of the $SiO_2$ film in the first and second embodiments, but each inter level dielectric 2 may be formed of a low-dielectric-constant film (low-k film). In this case, in general, the low-k film is weaker than the $SiO_2$ film, and has low durability with respect to the stress received by the CMP process. In this case, while the Cu effective wire is formed, the Cu dummy conductive layer may be provided in a predetermined portion of the low-k film. Accordingly, the low-k film which is more brittle than the $SiO_2$ film, or the Cu effective wire provided inside the film can be inhibited from being deteriorated. That is, the quality, reliability, electric characteristic and the like of the semiconductor device can be further enhanced.

Moreover, the structure of the Cu dummy conductive layer is not limited to the Cu dummy wire shown in FIG. 20 in the same manner as in the Cu conductive layer. For example, the Cu dummy conductive layer may be formed into the dual damascene structure shown in FIG. 4B, the single damascene structure shown in FIGS. 15 and 17, or the structure constituted of the via plug (contact plug) only, that does not include the wire, as shown in FIG. 19. As to the positions, number and the like of the Cu dummy conductive layers to be provided, the predetermined number of the layers may be provided in predetermined positions in accordance with the desired specifications of the semiconductor device in the same manner as in the Cu conductive layer. Furthermore, the only Cu dummy conductive layer may be formed and provided on the substrate.

Moreover, the method of forming the Cu film is not limited to the PVD or plating process, and the first Cu film may be formed, for example, by the CVD or ALD process. During the heating after providing the Cu film, the Cu film may reflow, and there is little possibility that the quality, reliability, electric characteristic or the like of the Cu film is deteriorated by the reflow of the Cu film. That is, there is little possibility that the quality, reliability, electric characteristic or the like of the semiconductor device is deteriorated by the reflow of the Cu film.

Furthermore, the respective first to fourth embodiments can be easily applied to various semiconductor devices such as a memory LSI represented by a logical large scale integrated (LSI) circuit, dynamic random access memory (DRAM), or static random access memory (SRAM), a bipolar transistor and the like.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A manufacturing method of a semiconductor device, comprising:
    providing a first barrier metal film by a PVD process in a recess formed in at least one insulating film provided above a substrate, the first barrier metal film containing at least one metal element belonging to any one of the groups 4-A, 5-A, and 6-A;
    sequentially providing a second barrier metal film by at least one of CVD and ALD processes on the first barrier metal film, without opening to atmosphere between providing the first barrier metal film and providing the second barrier metal film, the second barrier metal film containing at least one metal element belonging to any one of the groups 4-A, 5-A, and 6-A;
    sequentially providing a third barrier metal film by a PVD process on the second barrier metal film, without opening to the atmosphere between providing the second barrier metal film and providing the third barrier metal film, the third barrier metal film containing at least one metal element belonging to any one of the groups 4-A, 5-A, and 6-A;
    sequentially providing a first Cu film on the third barrier metal film, without opening to the atmosphere between providing the third barrier metal film and providing the first Cu film; and
    heating the first Cu film.

2. The method according to claim 1, further comprising:
    burying the recess with growing a second Cu film by a plating process on the first Cu film using the first Cu film as a seed layer before performing the heating.

3. The method according to claim 2, wherein the first and second Cu films form at least one of a wire integral with a plug, a wire separate from the plug, and a plug alone.

4. The method according to claim 2, wherein the insulating film, the first to third barrier metal films, and the first and second Cu films are stacked and provided into a plurality of layers.

5. The method according to claim 1, wherein a single-layer film substantially formed of Ti is provided as the third barrier metal film.

6. The method according to claim 1, wherein a single-layer film formed of one material of TiN, TiC, TiC, TiSiN, Ta, TaN, TaG, TaSiN, WN, WNC, WSiN, VN, and NbN, or a stacked film obtained by combining two or more of the single-layer films is provided as the second barrier metal film, and single-layer films substantially formed of Ti are provided as the first and third barrier metal films.

7. The method according to claim 1, wherein oxide of Ti is not generated in the vicinity of an interface between the third barrier metal film and the first Cu film.

8. The method according to claim 1, wherein the heating is performed at 420° C. or less.

9. The method according to claim 1, wherein the forming of the first Cu film is performed at a substrate temperature of 25° C. or more.

10. The method according to claim 1, further comprising:
    coating at least one conductive layer provided on a surface layer portion of the substrate or above the substrate with the insulating film;
    forming the recess in the insulating film by exposing the surface of the conductive layer; and
    providing the first barrier metal film in the recess with contacting the surface of the conductive layer.

* * * * *

UNITED STATES PATENT AND TRADEMARK OFFICE
CERTIFICATE OF CORRECTION

| | |
|---|---|
| PATENT NO. | : 7,399,706 B2 |
| APPLICATION NO. | : 11/041362 |
| DATED | : July 15, 2008 |
| INVENTOR(S) | : Omoto et al. |

Page 1 of 1

It is certified that error appears in the above-identified patent and that said Letters Patent is hereby corrected as shown below:

Claim 6, column 32, line 16, change "TiC, TiC," to --TiC, TiO,--.

Claim 6, column 32, line 17, change "TaG," to --TaC,--.

Signed and Sealed this

Seventh Day of April, 2009

JOHN DOLL
*Acting Director of the United States Patent and Trademark Office*